US012062679B2

(12) United States Patent
Kao et al.

(10) Patent No.: US 12,062,679 B2
(45) Date of Patent: Aug. 13, 2024

(54) BACKSIDE STRUCTURE FOR IMAGE SENSOR

(71) Applicant: Taiwan Semiconductor Manufacturing Co., Ltd., Hsinchu (TW)

(72) Inventors: Min-Feng Kao, Chiayi (TW); Dun-Nian Yaung, Taipei (TW); Jen-Cheng Liu, Hsin-Chu (TW); Wen-Chang Kuo, Tainan (TW); Shih-Han Huang, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 287 days.

(21) Appl. No.: 17/384,956

(22) Filed: Jul. 26, 2021

(65) Prior Publication Data
US 2022/0344383 A1 Oct. 27, 2022

Related U.S. Application Data

(60) Provisional application No. 63/180,359, filed on Apr. 27, 2021.

(51) Int. Cl.
*H01L 27/146* (2006.01)
(52) U.S. Cl.
CPC .... *H01L 27/1463* (2013.01); *H01L 27/14621* (2013.01); *H01L 27/14627* (2013.01); *H01L 27/14634* (2013.01); *H01L 27/1464* (2013.01); *H01L 27/14645* (2013.01); *H01L 27/14685* (2013.01); *H01L 27/14689* (2013.01); *H01L 27/1469* (2013.01)

(58) Field of Classification Search
CPC .................. H01L 27/1463; H01L 27/1464
See application file for complete search history.

(56) References Cited

U.S. PATENT DOCUMENTS 9,704,904 B2 * 7/2017 Lai ............... H01L 27/1464
9,871,070 B2 * 1/2018 Hsu ............... H01L 27/1463
10,147,756 B2 * 12/2018 Cheng ............ H05K 999/99
(Continued)

FOREIGN PATENT DOCUMENTS

JP 2017212453 A 11/2017

*Primary Examiner* — Mounir S Amer
*Assistant Examiner* — Alexander Belousov
(74) *Attorney, Agent, or Firm* — Eschweiler & Potashnik, LLC

(57) ABSTRACT

The present disclosure relates to an image sensor having an image sensing element surrounded by a BDTI structure, and an associated method of formation. In some embodiments, a first image sensing element and a second image sensing element are arranged next to one another within an image sensing die. A pixel dielectric stack is disposed along a back of the image sensing die overlying the image sensing elements. The pixel dielectric stack includes a first high-k dielectric layer and a second high-k dielectric layer. The BDTI structure is disposed between the first image sensing element and the second image sensing element and extends from the back of the image sensor die to a position within the image sensor die. The BDTI structure includes a trench filling layer surrounded by an isolation dielectric stack. The pixel dielectric stack has a composition different from that of the isolation dielectric stack.

20 Claims, 22 Drawing Sheets

(56) References Cited

U.S. PATENT DOCUMENTS

| | | | |
|---|---|---|---|
| 10,177,187 B2* | 1/2019 | Kalnitsky | H01L 27/1463 |
| 10,748,955 B2* | 8/2020 | Oh | H01L 27/14612 |
| 2014/0054662 A1* | 2/2014 | Yanagita | H01L 27/14645 |
| | | | 438/73 |
| 2014/0264709 A1* | 9/2014 | Tsai | H01L 25/0657 |
| | | | 438/26 |
| 2015/0001660 A1 | 1/2015 | Fukumizu et al. | |
| 2017/0062496 A1* | 3/2017 | Lai | H01L 27/1464 |
| 2018/0096936 A1* | 4/2018 | Wu | H01L 21/02271 |
| 2019/0096929 A1 | 3/2019 | Chiang et al. | |
| 2019/0103504 A1* | 4/2019 | Yamashita | H01L 27/14636 |
| 2020/0135789 A1 | 4/2020 | Cheng et al. | |
| 2022/0310678 A1* | 9/2022 | Li | H01L 21/76843 |

\* cited by examiner

BACKSIDE STRUCTURE FOR IMAGE SENSOR

REFERENCE TO RELATED APPLICATION

This Application claims the benefit of U.S. Provisional Application No. 63/180,359, filed on Apr. 27, 2021, the contents of which are hereby incorporated by reference in their entirety.

BACKGROUND

Many modern day electronic devices comprise optical imaging devices (e.g., digital cameras) that use image sensors. An image sensor may include an array of pixel sensors and supporting logic. The pixel sensors measure incident radiation (e.g., light) and convert to digital data, and the supporting logic facilitates readout of the measurements. One type of image sensor is a backside illuminated (BSI) image sensor device. BSI image sensor devices are used for sensing a volume of light projected towards a backside of a substrate (which is opposite to a front of the substrate where interconnect structures including multiple metal and dielectric layers are built thereon). BSI image sensor devices provide a reduced destructive interference, as compared to front illuminated (FSI) image sensor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
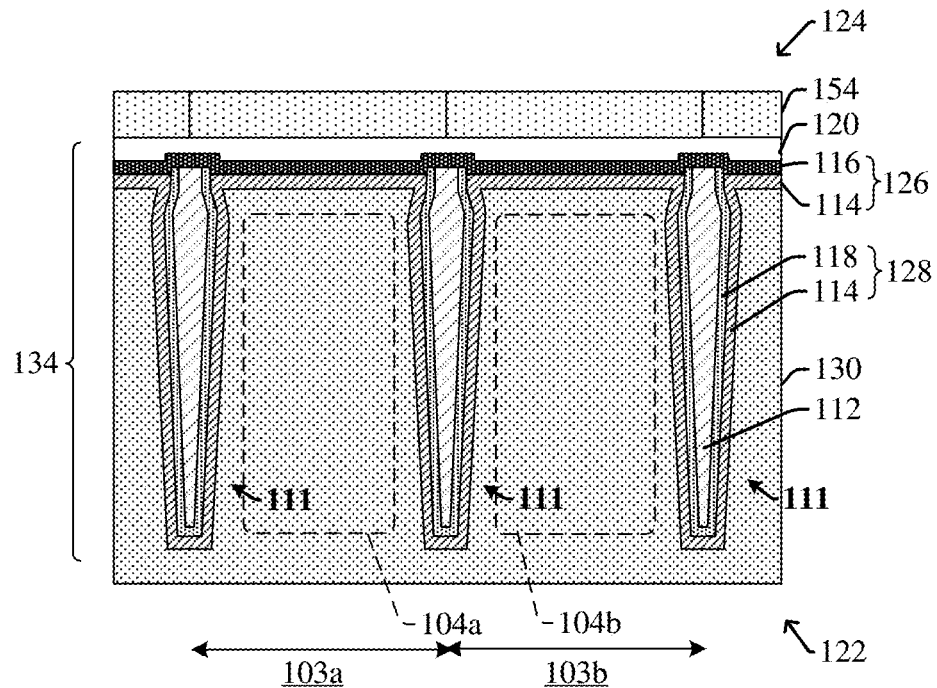
FIG. 1 illustrates a cross-sectional view of some embodiments of an image sensor comprising an image sensing element underlying a pixel dielectric stack and surrounded by a backside deep trench isolation (BDTI) structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuit (IC) technologies are constantly being improved. Such improvements frequently involve scaling down device geometries to achieve lower fabrication costs, higher device integration densities, higher speeds, and better performance. A complementary metal-oxide-semiconductor (CMOS) image sensor (CIS) device includes a plurality of pixels arranged on or within a substrate. A pixel has an image sensing element to receive incident light and convert the incident light to electric signal. Due to device scaling, the plurality of pixels of the CIS device become smaller and are closer to one another. In order to improve quantum efficiency of the CIS and to improve electrical and optical isolation between neighboring pixels of the image sensor, the plurality of pixels is separated from one another by an isolation structure.

The isolation structure may include a backside deep trench isolation (BDTI) structure between neighboring pixels of the image sensor. One kind of image sensor fabrication processes includes forming a grid of deep isolation trenches between the neighboring pixels followed by forming layers of different materials to fill the deep trenches and extend above the pixels. However, forming a high aspect ratio BDTI structure in the scaled CIS device is challenging. For example, as lateral dimensions of the deep isolation trenches are reduced, it is difficult to perform deep implant or completely fill the deep isolation trenches. An incomplete filling of the deep isolation trenches results in the presence of voids in the BDTI structure, which may negatively affect optical and electrical performance of the CIS device.

In view of the above, the present disclosure relates to an image sensor comprising a backside structure, and an associated method of formation. In some embodiments, the backside structure includes a backside deep trench isolation (BDTI) structure between neighboring pixels of the image sensor and a pixel dielectric stack overlying respective pixels of the image sensor. The pixel dielectric stack includes some dielectric material enhancing optical absorption within the pixels, while the BDTI structure includes some other dielectric material reducing blooming and crosstalk between the pixels. By having different dielectric compositions for the BDTI structure between the pixels and the pixel dielectric stack overlying the respective pixels, the BDTI structure can be better filled, and the pixel dielectric stack can be formed with more flexibility. As a result, optical and electrical performance of the CIS device is improved.

In some embodiments, the image sensor comprises an image sensing die having a front and a back opposite to the front. A first image sensing element and a second image sensing element with a first doping type are arranged next to one another within the image sensing die. The pixel dielectric stack is disposed along the back of the image sensing die overlying the first image sensing element and the second image sensing element. The pixel dielectric stack comprises a first high-k dielectric layer and a second high-k dielectric layer disposed over the first high-k dielectric layer. The BDTI structure is disposed between the first image sensing element and the second image sensing element and extends from the back of the image sensor die to a position within the image sensor die. The BDTI structure comprises a trench filling layer surrounded by an isolation dielectric stack. As discussed above, the pixel dielectric stack has a first composition different from a second composition of the isolation dielectric stack.

In some further embodiments, the first high-k dielectric layer extends downwardly along the trench filling layer as part of the isolation dielectric stack. The second high-k dielectric layer may be disposed on the first high-k dielectric layer and extended in lateral covering a top surface of the trench filling layer. In some alternative embodiments, the first high-k dielectric layer and the second high-k dielectric layer terminate at and directly contacts a sidewall of the isolation dielectric stack. The isolation dielectric stack may comprise an isolation dielectric liner of silicon dioxide or high-k dielectric material. The isolation dielectric stack may further comprise an isolation conductive liner disposed between the isolation dielectric liner and the trench filling layer. The trench filling layer may be or be comprised of metal.

FIG. 1 illustrates a cross-sectional view of an image sensor 100. The image sensor 100 comprises an image sensing die 134 having a plurality of pixel regions that may be arranged in an array comprising rows and/or columns, such as pixel regions 103a, 103b shown in FIG. 1. The pixel regions 103a, 103b respectively comprises a first image sensing element 104a and a second image sensing element 103b configured to convert incident radiation (e.g., photons) into an electric signal. In some embodiments, the image sensing elements 104a, 104b are photodiode doping columns or portions of a photodiode doping layer 130 or a doping well having a first doping type (e.g., n-type doping by dopants such as phosphorus, arsenic, antimony, etc.). The image sensing elements 104a, 104b may be disposed on or within an adjoining second region (not shown in FIG. 1) such as a doped substrate or well having a second doping type (e.g., p-type doping by dopants such as boron, aluminum, indium, etc.) that is different than the first doping type.

The image sensing die 134 has a front 122 and a back 124. A BDTI structure 111 is disposed between the first image sensing element 104a and the second image sensing element 104b and extends from the back 124 of the image sensing die 134 to a position within the image sensing die 134. The BDTI structure 111 comprises a trench filling layer 112 surrounded by an isolation dielectric stack 128 according to some embodiments. The isolation dielectric stack 128 may comprise an isolation dielectric liner 118 lining bottom and sidewall surfaces of the trench filling layer 112. The isolation dielectric stack 128 may further comprise some other conformal dielectric layers reducing blooming and crosstalk between the pixel regions 103a, 103b.

A pixel dielectric stack 126 is disposed along the back 124 of the image sensing die 134 overlying the first image sensing element 104a and the second image sensing element 104b. The pixel dielectric stack 126 has a first composition different from a second composition of the isolation dielectric stack 128. The pixel dielectric stack 126 comprises dielectric material enhancing optical absorption within the pixel regions 103a, 103b and may have a greater thickness. By having different dielectric compositions for the BDTI structure 111 and the pixel dielectric stack 126, the BDTI structure 111 can be better filled, and pixel dielectric stack 126 can be arranged with more flexibility. In some embodiments, a flat layer 120 is formed on the pixel dielectric stack 126 to provide a flatting upper surface. In some embodiments, the flat layer 120, or an additional dielectric layer disposed above the flat layer 120 may server as a bottom anti-reflective layer (BARL) to reduce reflection of incident photons. In some embodiments, the flat layer 120 may be or be comprised, for example, silicon oxynitride or some other suitable anti-reflective material(s). As a result, optical and electrical performance of the image sensor 100 is improved.

In some embodiments, the pixel dielectric stack 126 comprises a first high-k dielectric layer 114 and a second high-k dielectric layer 116 disposed over the first high-k dielectric layer 114. The second high-k dielectric layer 116 may be disposed directly on the first high-k dielectric layer 114. In some embodiments, the first high-k dielectric layer 114 extends downwardly along the bottom and sidewall surfaces of the trench filling layer 112 as part of the isolation dielectric stack 128. The first high-k dielectric layer 114 may be a conformal layer. The second high-k dielectric layer 116 may cover the entire top surface of the trench filling layer 112 or the BDTI structure 111. The second high-k dielectric layer 116 may be absent from the BDTI structure 111.

In some embodiments, the first high-k dielectric layer 114 is or is comprised of aluminum oxide ($Al_2O_3$), hafnium oxide ($HfO_2$), hafnium silicon oxide (HfSiO), or hafnium aluminum oxide (HfAlO). The second high-k dielectric layer 116 is or is comprised of tantalum oxide ($Ta_2O_5$). Other applicable high-k dielectric materials are also within the scope of the disclosure. Tantalum oxide ($Ta_2O_5$) or other similar high-k dielectric material that is easier to overhang when formed is not desired for the BDTI structure 111. Filling these kinds of materials in an isolation trench may cause voids in the BDTI structure 111, which would negatively affect optical and electrical performance of the image sensor 100. The isolation dielectric liner 118 is or is comprised of silicon dioxide. Alternatively, the isolation dielectric liner 118 is or is comprised of high-k dielectric material. The trench filling layer 112 is or is comprised of metal, such as aluminum, ruthenium, or the like. Alternatively, the trench filling layer 112 is or is comprised of dielectric material such as silicon dioxide, silicon nitride, and/or other applicable dielectric material. In some embodiments, the first high-k dielectric layer 114 may have a thickness in a range of about 30 Å to about 500 Å (120 Å as an example). The isolation dielectric liner 118 may have a thickness in a range of about 50 Å to about 3000 Å (200 Å for the same example). The second high-k dielectric layer 116 may have a thickness in a range of about 200 Å to about 1500 Å (400 Å for the same example). In some embodiments, the BDTI structure 111 may have a depth in a range of between approximately 1.5 µm and approximately 5 µm. A lateral dimension of the BDTI structure 111 may have a range between approximately 0.1 µm and approximately 0.3 µm. The lateral dimension of the BDTI structure 111 should be sufficient to perform the formation of the dielectric and conductive layers inside the BDTI structure (for example, as described associated with FIGS. 1-5).

The first high-k dielectric layer 114 and the second high-k dielectric layer 116 facilitate light absorptions within the pixel regions 103a, 103b. The second high-k dielectric layer 116 may be thicker than the first high-k dielectric layer 114. In some embodiments, the second high-k dielectric layer 116 is about two times or thicker than the first high-k dielectric layer 114. The thinner and more conformal first high-k dielectric layer 114 helps to better fill deep trenches and form the BDTI structure 111 with better conformity. The first high-k dielectric layer 114 may also act as a passivation layer passivating surface damages caused by trench etching. The isolation dielectric liner 118 may absorb or reflect incident light to help reduce blooming and crosstalk between the pixel regions 103a, 103b. The thicker second high-k dielectric layer 116 helps to enhance optical absorption within the pixel regions 103a, 103b.

In some embodiments, a plurality of color filters 154 are arranged over the back 124 of the image sensing die 134. The plurality of color filters 154 are respectively configured to transmit specific wavelengths of incident radiation. For example, a first color filter (e.g., a red color filter) may transmit light having wavelengths within a first range, while a second color filter may transmit light having wavelengths within a second range different than the first range. In some embodiments, the plurality of color filters 154 may be arranged within a grid structure overlying the image sensing elements 104a, 104b of the pixel regions 103a, 103b.

Figure 2:
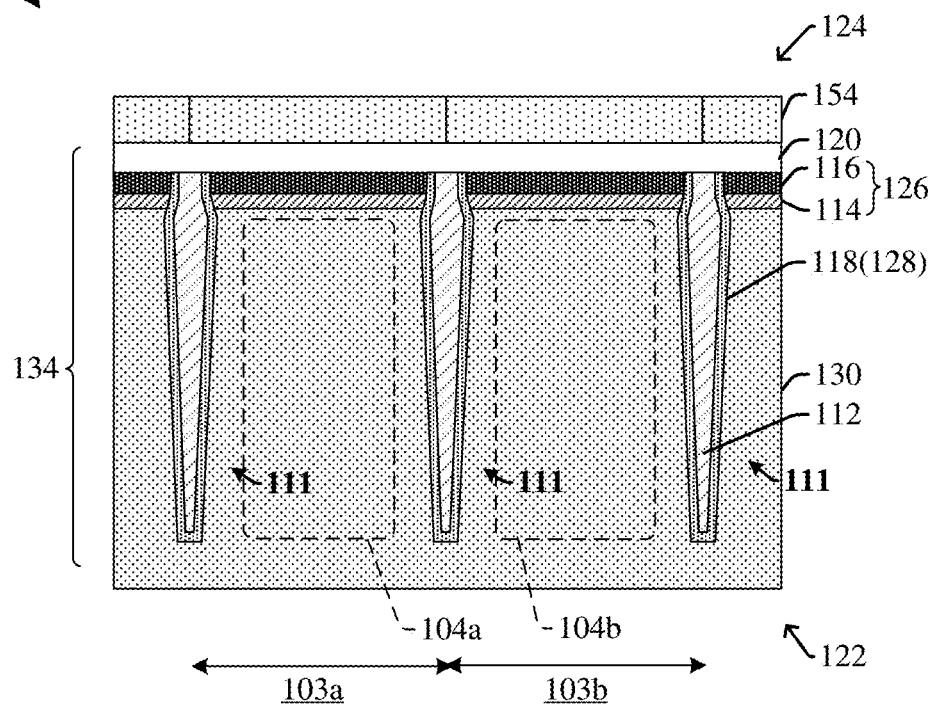
FIG. 2 illustrates a cross-sectional view of some alternative embodiments of an image sensor comprising an image sensing element underlying a pixel dielectric stack and surrounded by a backside deep trench isolation (BDTI) structure.

FIG. 2 illustrates a cross-sectional view of an image sensor 200 comprising image sensing elements 104a, 104b surrounded by a BDTI structure 111 according to some other embodiments. Features of the image sensor 100 shown in FIG. 1 and other figures can be incorporated in the image sensor 200 when applicable. In addition, in some embodiments alternative to FIG. 1, the pixel dielectric stack 126 comprises the first high-k dielectric layer 114 and the second high-k dielectric layer 116 that terminate at and directly contact a sidewall of the isolation dielectric stack 128. In some embodiments, the isolation dielectric stack 128 may comprise the isolation dielectric liner 118. In some embodiments, the isolation dielectric liner 118 is or is comprised of silicon dioxide. Alternatively, the isolation dielectric liner 118 is or is comprised of aluminum oxide ($Al_2O_3$), hafnium oxide ($HfO_2$), hafnium silicon oxide (HfSiO), or hafnium aluminum oxide (HfAlO). Tantalum oxide ($Ta_2O_5$) or other similar high-k dielectric material that is easier to overhang when formed may be used to form the second high-k dielectric layer 116, but is not desired for the isolation dielectric liner 118 within the BDTI structure 111. Filling these kinds of material in isolation trench may cause voids in the BDTI structure 111, which would negatively affect optical and electrical performance of the image sensor 200.

Figure 3:
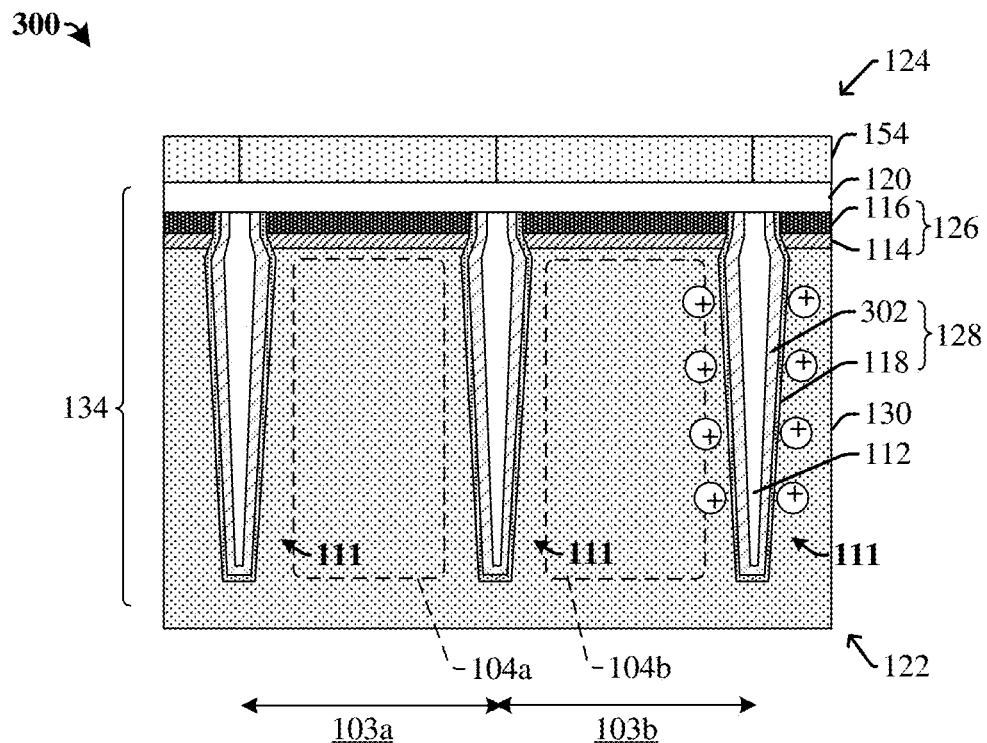
FIG. 3 illustrates a cross-sectional view of some alternative embodiments of an image sensor comprising an image sensing element underlying a pixel dielectric stack and surrounded by a backside deep trench isolation (BDTI) structure.

FIG. 3 illustrates a cross-sectional view of an image sensor 300 comprising image sensing elements 104a, 104b surrounded by a BDTI structure 111 according to some other embodiments. Features of the image sensors 100 and 200 shown in FIG. 1 and FIG. 2 and the image sensor shown in other figures can be incorporated in the image sensor 300 when applicable. In addition, in some embodiments alternative to FIG. 1 and FIG. 2, the isolation dielectric stack 128 further comprises an isolation conductive liner 302 disposed between the isolation dielectric liner 118 and the trench filling layer 112. The isolation conductive liner 302 may be or be comprised of metal, such as aluminum, ruthenium, or the like. The trench filling layer 112 may be or be comprised of dielectric material such as silicon dioxide, silicon nitride, and/or other applicable dielectric material. In some embodiments, during the operation, the isolation conductive liner 302 can be negatively biased to induce positive charges to recover damage of sidewalls of the BDTI structure 111 and thus improve performance.

Figure 4:
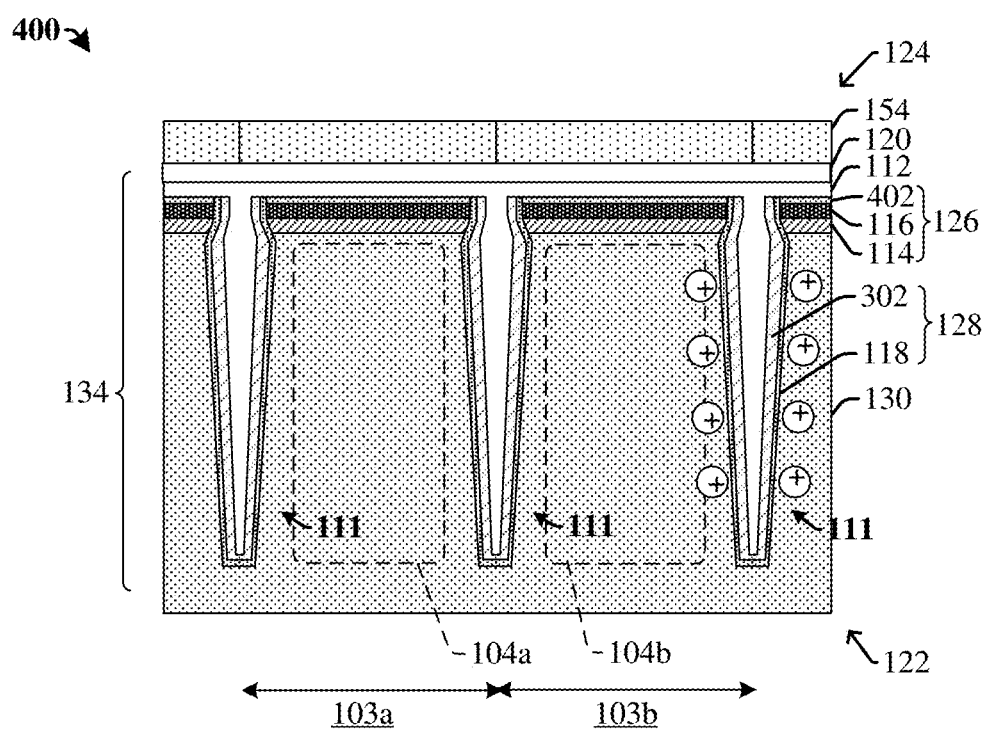
FIG. 4 illustrates a cross-sectional view of some alternative embodiments of an image sensor comprising an image sensing element underlying a pixel dielectric stack and surrounded by a backside deep trench isolation (BDTI) structure.

FIG. 4 illustrates a cross-sectional view of an image sensor 400 comprising image sensing elements 104a, 104b surrounded by a BDTI structure 111 according to some other embodiments. Features of the image sensors 100-300 shown in FIGS. 1-3 and the image sensor shown in other figures can be incorporated in the image sensor 400 when applicable. In addition, in some embodiments alternative to FIGS. 1-3, the trench filling layer 112 within the BDTI structure 111 may extend upwardly and disposed in lateral along the back 124 of the image sensing die 134. The flat layer 120 is then disposed on the trench filling layer 112 as a bottom anti-reflective layer (BARL) to reduce reflection of incident photons. In some embodiments, the flat layer 120 may be or be comprised, for example, silicon oxynitride or some other suitable anti-reflective material(s).

Figure 5:
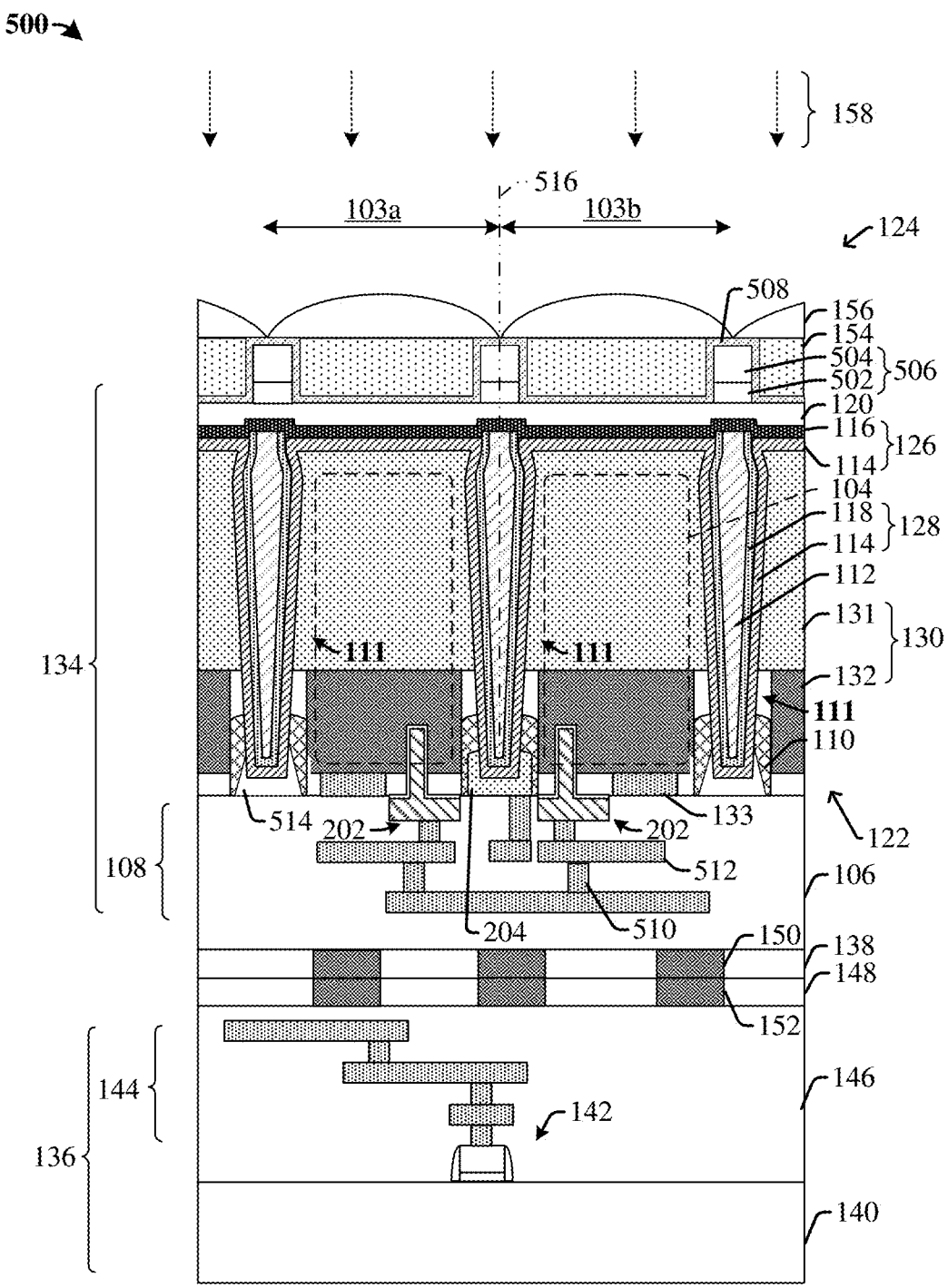
FIG. 5 illustrates a cross-sectional view of some embodiments of an integrated chip comprising an image sensing die and a logic die bonded together where the image sensing die comprising an image sensing element underlying a pixel dielectric stack and surrounded by a backside deep trench isolation (BDTI) structure.

FIG. 5 illustrates a cross-sectional view of an integrated chip 500 comprising an image sensing die 134 and a logic die 136 bonded together where the image sensing die 134 has an image sensing element 104 surrounded by a BDTI structure 111 according to some other embodiments. Features of the image sensors 100-400 shown in FIGS. 1-4 and the image sensors shown in other figures can be incorporated in the image sensing die 134 when applicable. In some embodiments, the photodiode doping layer 130 comprises an array deep n-type well 131 and an n-type photodiode layer 132. The BDTI structure 111 may extends from the back 124 of the image sensing die 134 through the array deep n-type well 131 as shown in FIG. 1.

In some embodiments, a doped shallow isolation well 110 is disposed between and isolate adjacent pixel regions 103a, 103b, extending from the front 122 of the image sensing die 134 to a position within the photodiode doping layer 130. The doped shallow isolation well 110 may have the second doping type (e.g., p-type doping). In some embodiments, a bottom portion of the BDTI structure 111 may be disposed within a recessed top surface of the doped shallow isolation well 110. In this case, the doped shallow isolation well 110 may reach less than half or less than ¼ of the depth of the BDTI structure 111. The doped shallow isolation well 110 may be vertically aligned with the BDTI structure 111 (e.g. sharing a common center line 516). The BDTI structure 111 and the doped shallow isolation well 110 collectively function as isolations for the pixel regions 103a, 103b, such that crosstalk and blooming among the pixel regions 103a, 103b can be reduced. The doped shallow isolation well 110 also facilitates depletion of the image sensing elements 104 during the operation by providing additional p-type dopants to the image sensing elements 104, such that full well capacity is improved.

In some embodiments, a floating diffusion well 204 is disposed between the adjacent pixel regions 103a, 103b from the front 122 of the image sensing die 134 to a position within the photodiode doping layer 130. In some embodiments, the BDTI structure 111 extends to a location overlying the floating diffusion well 204. The BDTI structure 111 and the floating diffusion well 204 may be vertically aligned (e.g. sharing a common center line 516). A transfer gate 202 is arranged along the front 122 of the image sensing die 134 at a position laterally between the image sensing element 104 and the floating diffusion well 204. The transfer gate 202 may extend from the front 122 of the image sensing die 134 to a position within the n-type photodiode layer 132. During the operation, the transfer gate 202 controls charge transfer from the image sensing element 104 to the floating diffusion well 204. If the charge level is sufficiently high within the floating diffusion well 204, a source follower transistor (not shown) is activated and charges are selectively output according to operation of a row select transistor (not shown) used for addressing. A reset transistor (not shown) can be used to reset the image sensing element 104 between exposure periods.

Also, a shallow trench isolation (STI) structure 514 may be disposed between the adjacent pixel regions 103a, 103b from the front 122 of the image sensing die 134 to a position within the photodiode doping layer 130. The STI structure 514 and the BDTI structure 111 may be vertically aligned (e.g. sharing a common center line, which may or may not share a center line with the doped shallow isolation well 110). In some embodiments, the doped shallow isolation well 110 extends from the front 122 of the image sensing die 134 to a position within the photodiode doping layer 130 and surrounds the STI structure 514. In some alternative embodiments, the doped shallow isolation well 110 may separate the STI structure 514 from the photodiode doping layer 130 and/or the BDTI structure 111. The BDTI structure 111, the doped shallow isolation well 110, and the STI structure 514 collectively function as isolations for the pixel regions 103a, 103b, such that crosstalk and blooming among the pixel regions 103a, 103b can be reduced.

The image sensing die 134 may further comprise a composite grid 506 disposed between and overlying pixel regions 103a, 103b. The composite grid 506 may comprise a metal layer 502 and a dielectric layer 504 one stacked another at the back 124 of the image sensing die 134. A dielectric liner 508 lines sidewall and top of the composite grid 506. The metal layer 502 may be or be comprised of one or more layers of tungsten, copper, aluminum copper, or titanium nitride. The metal layer 502 may have a thickness range between approximately 100 nm and approximately 500 nm. The dielectric layer 504 may be or be comprised of one or more layers of silicon dioxide, silicon nitride, or the combination thereof. The dielectric layer 504 may have a thickness range between approximately 200 nm and approximately 800 nm. The dielectric liner 508 may be or be comprised of an oxide, such as silicon dioxide. The dielectric liner 508 may have a thickness range between approximately 5 nm and approximately 50 nm. Other applicable metal materials are also within the scope of the disclosure.

A metallization stack 108 may be arranged on the front 122 of the image sensing die 134. The metallization stack 108 comprises a plurality of metal interconnect layers arranged within one or more inter-level dielectric (ILD) layer 106. The ILD layer 106 may comprise one or more of a low-k dielectric layer (i.e., a dielectric with a dielectric constant less than about 3.9), an ultra low-k dielectric layer, or an oxide (e.g., silicon oxide). In some alternative embodiments, the BDTI structure 111 may extend through the photodiode doping layer 130 and reach on the ILD layer 106 or a gate dielectric layer of transistor devices such as a gate dielectric of the transfer gate 202.

The logic die 136 may comprise logic devices 142 disposed over a logic substrate 140. The logic die 136 may further comprises a metallization stack 144 disposed within an ILD layer 146 overlying the logic devices 142. The image sensing die 134 and the logic die 136 may be bonded face to face, face to back, or back to back. As an example, FIG. 5 shows a face to face bonding structure where a pair of intermediate bonding dielectric layers 138, 148, and bonding pads 150, 152 are arranged between the image sensing die 134 and the logic die 136 and respectively bond the metallization stacks 108, 144 through a fusion or a eutectic bonding structure.

In some embodiments, a plurality of micro-lenses 156 is arranged over the plurality of color filters 154. Respective micro-lenses 156 are aligned laterally with the color filters 154 and overlie the pixel regions 103a, 103b. In some embodiments, the plurality of micro-lenses 156 have a substantially flat bottom surface abutting the plurality of color filters 154 and a curved upper surface. The curved upper surface is configured to focus incident radiation 158 towards the underlying pixel regions 103a, 103b. During operation of the integrated chip 500, the incident radiation 158 is focused by the micro-lenses 156 to the underlying pixel regions 103a, 103b. When incident radiation or incident light of sufficient energy strikes the image sensing elements 104, it generates an electron-hole pair that produces a photocurrent. Notably, though the plurality of micro-lenses 156 is shown as fixing onto the image sensor in FIG. 5, it is appreciated that the image sensor may not include micro-lens, and the micro-lens may be attached to the image sensor later in a separate manufacture activity.

FIGS. 6-20 illustrate some embodiments of cross-sectional views 600-2000 showing a method of forming an image sensor having an image sensing element surrounded by a BDTI structure. In some embodiments, the formation of the BDTI structure includes forming a deep trench from a back of an image sensing die followed by forming an isolation dielectric stack along sidewall and bottom surfaces of the deep trench and a trench filling layer within a remaining space of the deep trench. A pixel dielectric stack is formed along the back of the image sensing die overlying the image sensing element. By forming the pixel dielectric stack and the isolation dielectric stack of different dielectric compositions, the deep trench can be better filled, and the pixel dielectric stack can be formed with more flexibility. As a result, optical and electrical performance of the CIS device is improved.

Figure 6:
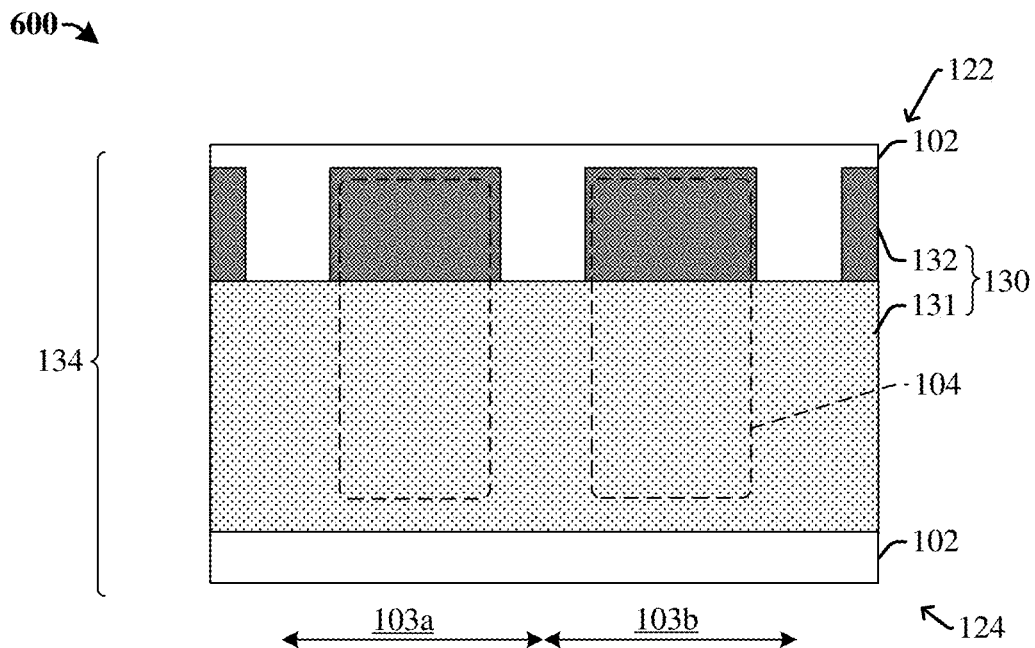
FIGS. 6-20 illustrate some embodiments of cross-sectional views showing a method of forming an image sensor having an image sensing element underlying a pixel dielectric stack and surrounded by a BDTI structure.

As shown in cross-sectional view 600 of FIG. 6, a substrate 102 is prepared for an image sensing die 134. In various embodiments, the substrate 102 may comprise any type of semiconductor body (e.g., silicon/germanium/CMOS bulk, SiGe, SOI, etc.) such as a semiconductor wafer or one or more die on a wafer, as well as any other type of semiconductor and/or epitaxial layers formed thereon and/or otherwise associated therewith. As an example, a photodiode doping layer 130 of a first doping type is formed on or within a handling substrate including a plurality of image sensing elements 104 formed within the pixel regions 103a, 103b. In some embodiments, the photodiode doping layer 130 is formed by forming a doping well such as an array deep n-type well 131 within a p-type substrate or well, and then forming an n-type photodiode layer 132 on the array deep n-type well 131. The array deep n-type well 131 and the n-type photodiode layer 132 may be formed by a doping process that may be or be comprised of, for example, ion implantation or some other suitable doping process. In some embodiments, the n-type photodiode layer 132 may be selectively implanted according to patterned masking layers (not shown) comprising photoresist. In some alternative embodiments, the photodiode doping layer 130 is formed on the substrate 102 by an epitaxial process.

Figure 7:
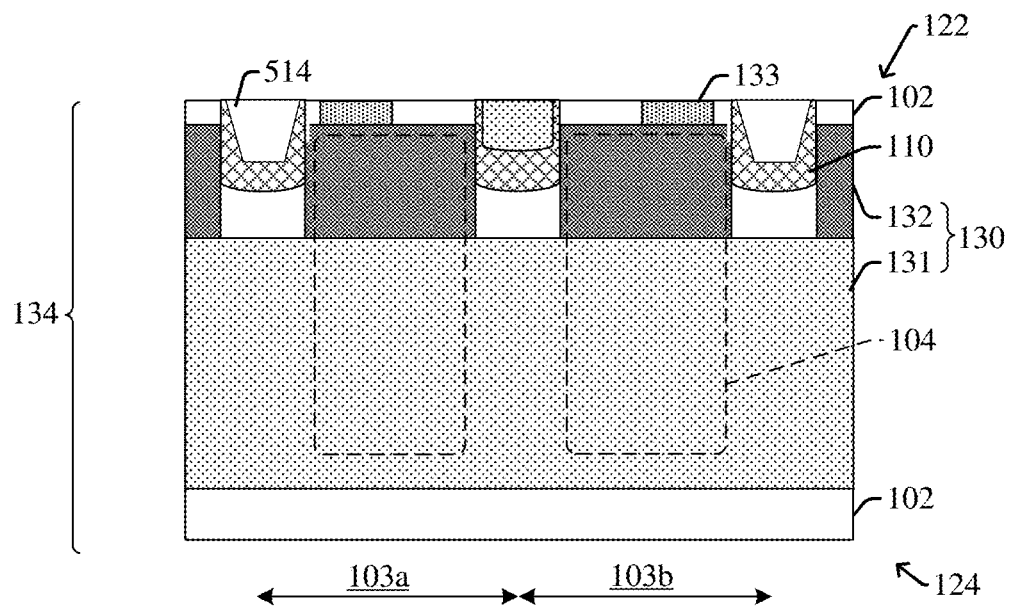

As shown in cross-sectional view 700 of FIG. 7, in some embodiments, dopant species are implanted into the substrate 102 to form doped regions. A plurality of doped shallow isolation wells 110 may be formed by implanting p-type dopant species into the photodiode doping layer 130 between adjacent pixel regions 103a, 103b. A p-type pinning layer 133 may be formed on the n-type photodiode layer 132. The plurality of doped shallow isolation wells 110 and the p-type pinning layer 133 may be formed from the front 122 of the image sensing die 134.

Also shown in FIG. 7, a plurality of STI structures 514 may be formed at a boundary and/or between adjacent pixel regions 103a, 103b from a front 122 of the image sensing die 134. The one or more STI structures 514 may be formed by selectively etching the front 122 of the image sensing die 134 to form shallow-trenches and subsequently forming an oxide within the shallow-trenches. The STI structures 514 may respectively be centrally aligned with the doped shallow isolation wells 110.

Figure 8:
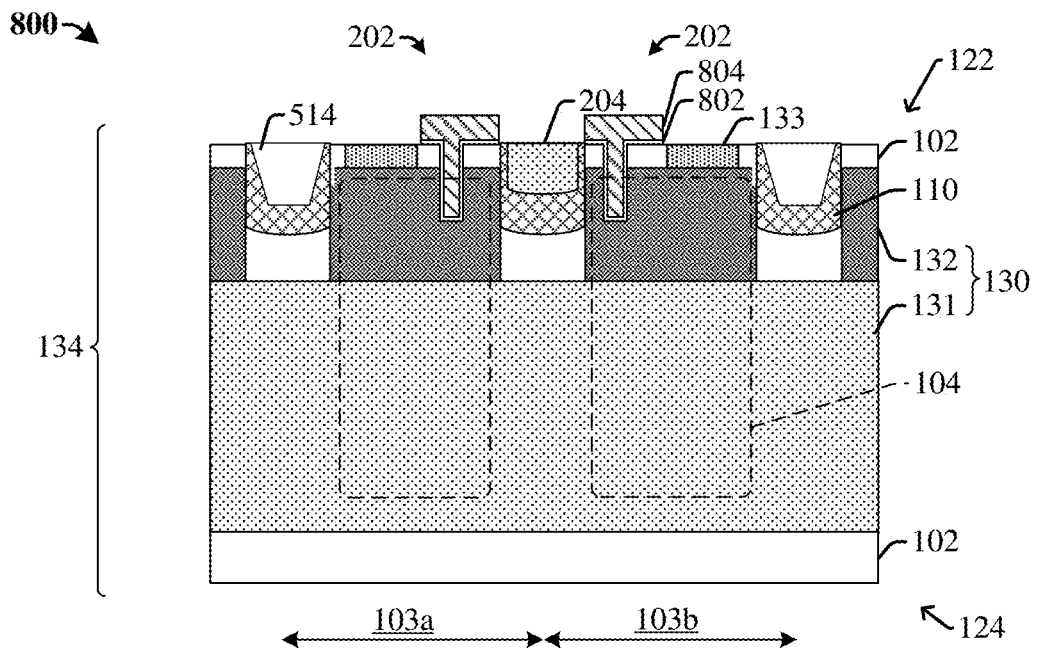

As shown in cross-sectional view 800 of FIG. 8, in some embodiments, a transfer gate 202 is formed over a front 122 of the image sensing die 134. The transfer gate 202 may be formed by depositing and patterning a gate dielectric layer and a gate electrode layer to form a gate dielectric 802 and a gate electrode 804. In some embodiments, a trench may be formed extending from the front 122 of the image sensing die 134 to a position within the n-type photodiode layer 132, and the transfer gate 202 may be subsequently formed within the trench and over the front 122 of the image sensing die 134. In some embodiments, an implantation process is performed within the front 122 of the image sensing die 134 to form a floating diffusion well 204 along one side of the transfer gate 202 or opposing sides of a pair of the transfer gates 202.

Figure 9:
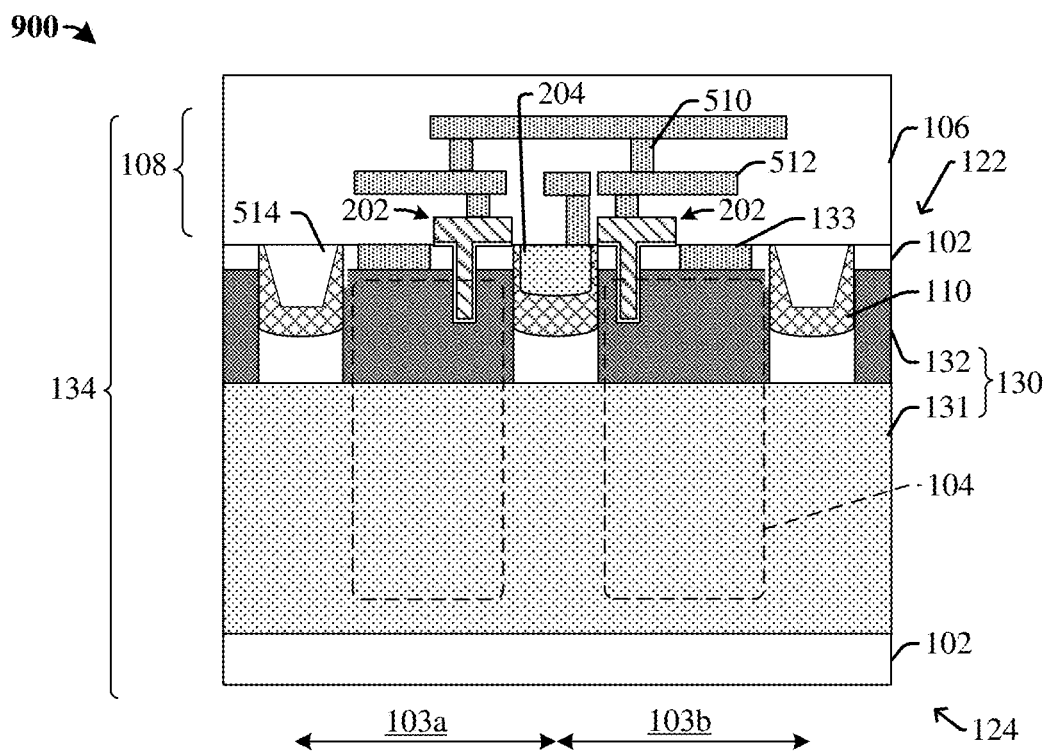

As shown in cross-sectional view 900 of FIG. 9, in some embodiments, a metallization stack 108 may be formed on the front 122 of the image sensing die 134. In some embodiments, the metallization stack 108 may be formed by forming an ILD layer 106, which comprises one or more layers of ILD material, on the front 122 of the image sensing die 134. The ILD layer 106 is subsequently etched to form via holes and/or metal trenches. The via holes and/or metal trenches are then filled with a conductive material to form the plurality of metal interconnect vias 510 and metal lines 512. In some embodiments, the ILD layer 106 may be deposited by a physical vapor deposition technique (e.g., PVD, CVD, etc.). The plurality of metal interconnect layers may be formed using a deposition process and/or a plating process (e.g., electroplating, electro-less plating, etc.). In various embodiments, the plurality of metal interconnect layers may comprise tungsten, copper, or aluminum copper, for example.

Figure 10:
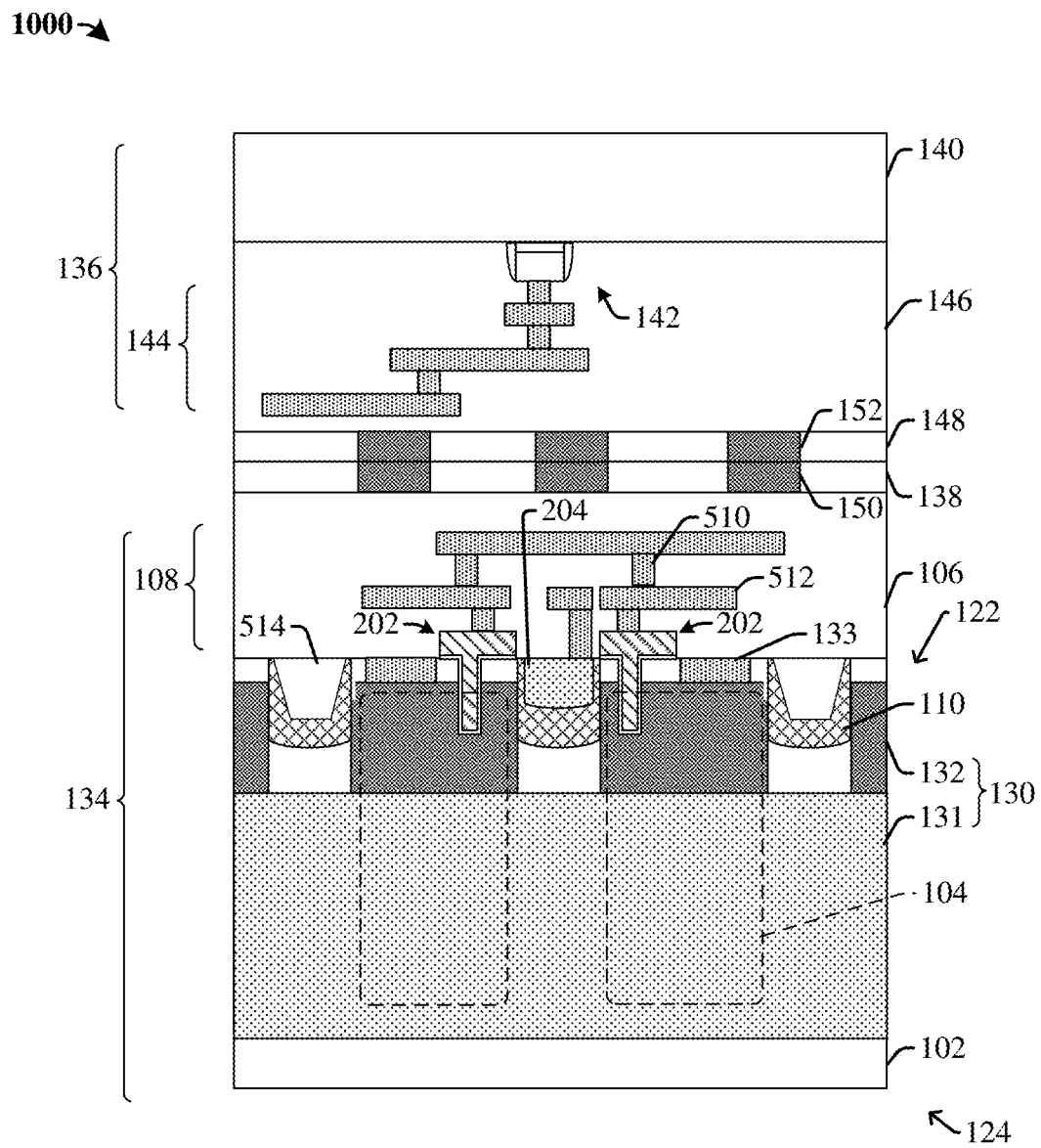

As shown in cross-sectional view 1000 of FIG. 10, in some embodiments, the image sensing die 134 can be then bonded to one or more other dies. For example, the image sensing die 134 can be bonded to a logic die 136 prepared to have logic devices 142. The image sensing die 134 and the logic die 136 may be bonded face to face, face to back, or back to back. For example, the bonding process may use a pair of intermediate bonding dielectric layers 138, 148, and bonding pads 150, 152 to bond the metallization stacks 108, 144 of the image sensing die 134 and the logic die 136. The bonding process may comprise a fusion or a eutectic bonding process. The bonding process may also comprise a hybrid bonding process including metal to metal bonding of the bonding pads 150, 152, and dielectric to dielectric bonding of the intermediate bonding dielectric layers 138, 148. An annealing process may follow the hybrid bonding process, and may be performed at a temperature range between about 250° C. to about 450° for a time in a range of about 0.5 hour to about 4 hours, for example.

Figure 11:
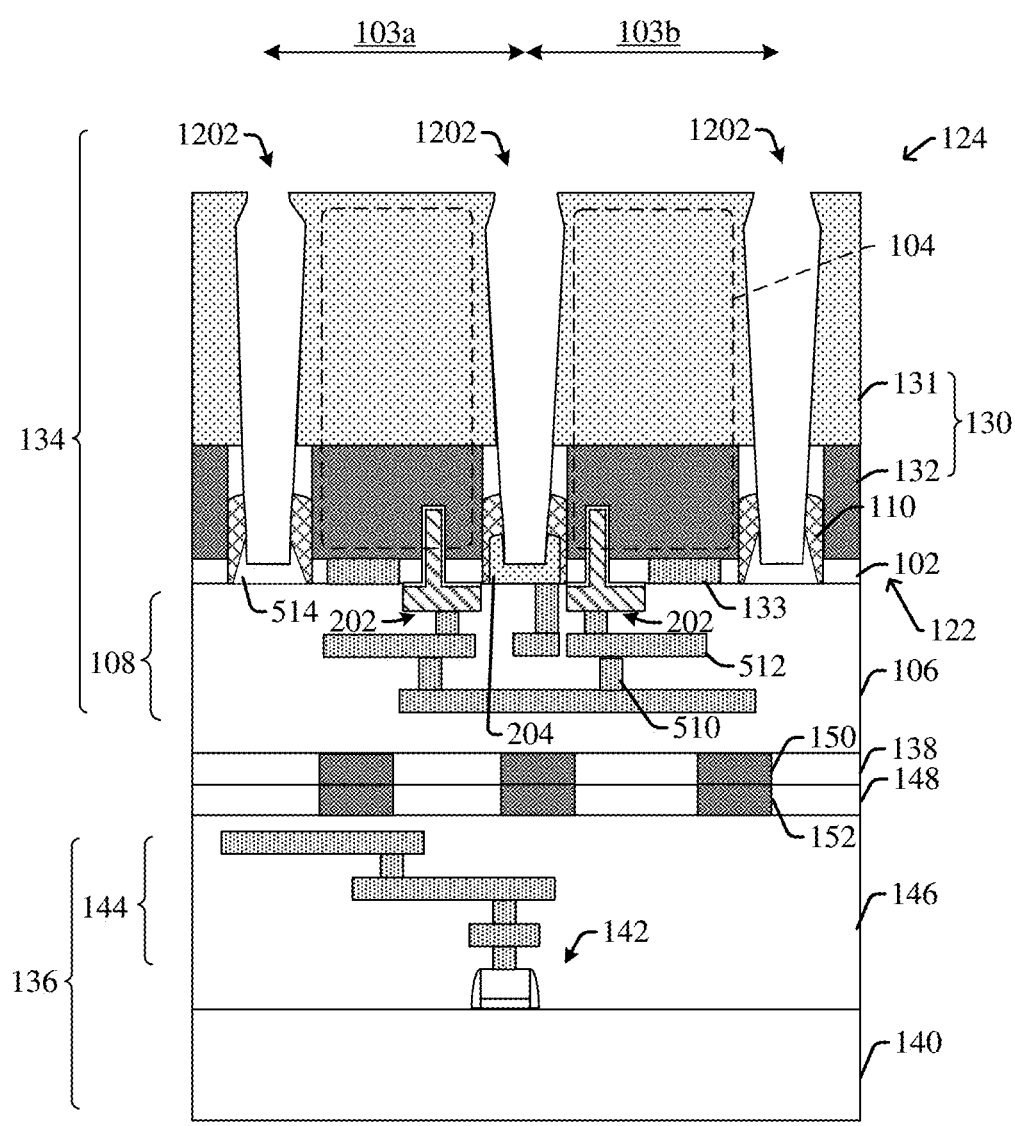

As shown in cross-sectional view 1100 of FIG. 11, in some embodiments, deep trenches 1202 are formed from a back 124 of the image sensing die 134 laterally separating the image sensing elements 104. In some embodiments, the photodiode doping layer 130 may be etched by forming a masking layer onto the back 124 of the image sensing die 134 and exposing the photodiode doping layer 130 to an etchant in regions not covered by the masking layer. In some alternative embodiments, the substrate 102 or the photodiode doping layer 130 is etched thoroughly in depth when forming the deep trenches 1202, and the deep trenches 1202 extend through the substrate 102 and may reach on the ILD layer 106, such that a complete isolation is achieved. In various embodiments, the masking layer may comprise photoresist or a nitride (e.g., SiN) patterned using a photolithography process. The masking layer may also comprise atomic layer deposition (ALD) or plasma enhanced CVD oxide layer with a thickness range between about 200 angstrom (Å) to about 1000 angstrom (Å). In various embodiments, the etchant may comprise a dry etchant have an etching chemistry comprising a fluorine species (e.g., $CF_4$, $CHF_3$, $C_4F_8$, etc.) or a wet etchant (e.g., hydroflouric acid (HF) or tetramethylammonium hydroxide (TMAH)). The deep trenches 1202 may have a depth range between approximately 1.5 μm and approximately 5 μm. A lateral dimension may have a range between approximately 0.1 μm and approximately 0.3 μm. The etching process to form the deep trench 1202 may involve anisotropic etching processes including dry etching and wet etching that may create an under-cut profile. In some embodiments, the etching to form the deep trench 1202 may introduce a bowing tip at the top corner of the deep trenches 1202 has a bowing angle in a range of about 8° to 15° from an upper sidewall of the deep trenches 1202 to a vertical line perpendicular to a lateral plane of the array deep n-type well 131. In some alternative embodiments, the bowing tip is smaller than about 8°. The bowing top may be then removed or reduced by a cleaning process, leaving a smooth sidewall surface and a less bowing neck for the deep trench 1202.

In some embodiments, the image sensing die 134 is thinned on the back 124 prior to forming the deep trenches 1202. The thinning process may partially or completely remove the p-type substrate (See FIG. 10) and allow for radiation to pass through the back 124 of the image sensing die 134 to the image sensing element 104. In some embodiments, the image sensing die 134 is thinned to expose the image sensing elements 104, such that radiation can reach on the photodiode more easily. Then a later formed BDTI structure (see BDTI structure 111 in FIG. 13 for example) may be formed to reach on a surface of the image sensing elements 104. The thinning process may be performed by an etching or a mechanical grinding of the back 124 of the image sensing die 134. An example of the etchant may include hydrogen fluoride/nitric/acetic acid (HNA). A chemical mechanical process and a tetramethylammonium hydroxide (TMAH)) wet etching may then follow to further thin the image sensing die 134.

Figure 12:
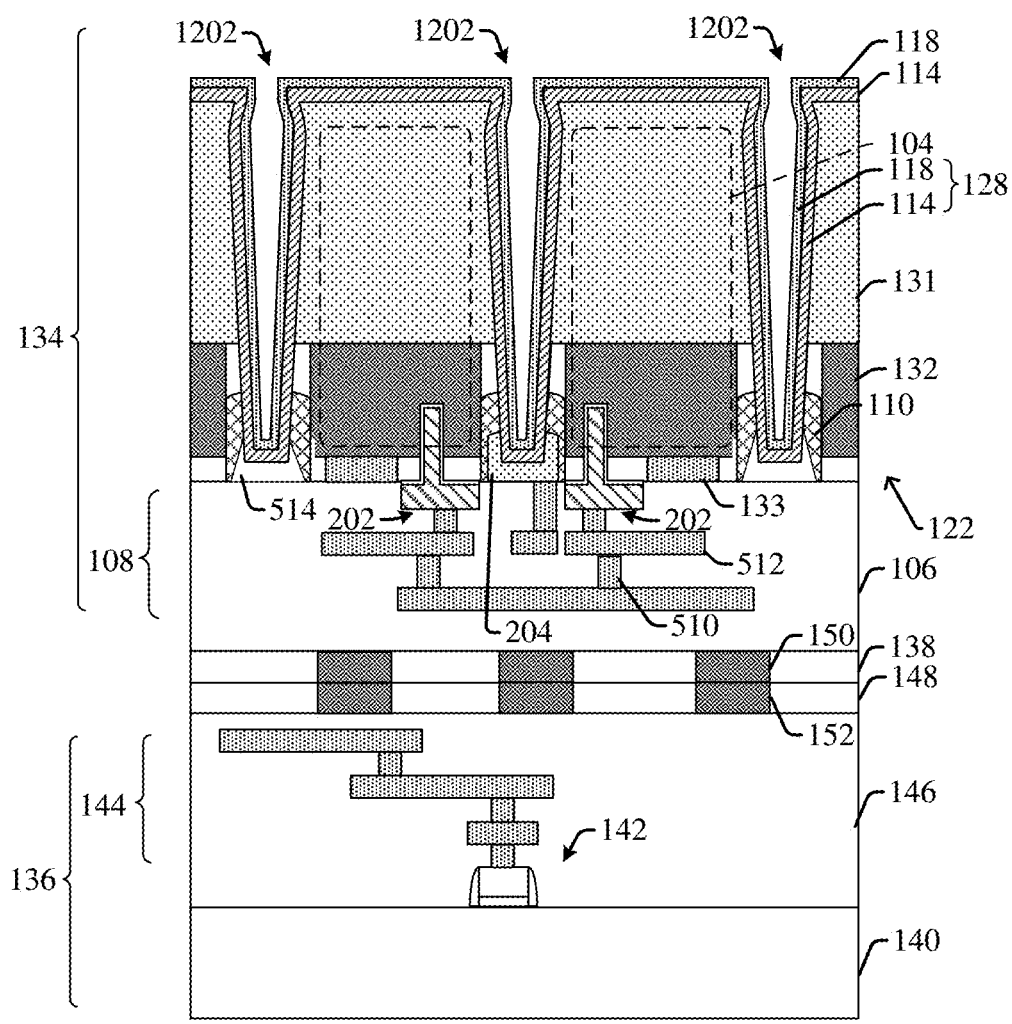

As shown in cross-sectional view 1200 of FIG. 12, in some embodiments, the deep trenches 1202 are then filled with dielectric materials. In some embodiments, a first high-k dielectric layer 114 is formed within the deep trenches 1202. The first high-k dielectric layer 114 may be formed by deposition techniques and may comprise aluminum oxide (AlO), hafnium oxide (HfO), or other dielectric materials having a dielectric constant greater than that of silicon oxide. The first high-k dielectric layer 114 lines sidewalls and bottom surfaces of the deep trenches 1202. In some embodiments, the first high-k dielectric layer 114 may be formed in conformal and extending over the back 124 of the image sensing die 134 between the deep trenches 1202. In some embodiments, an isolation dielectric liner 118 is then formed on the first high-k dielectric layer 114. The isolation dielectric liner 118 may be formed of silicon dioxide, for example. The isolation dielectric liner 118 may also be formed in conformal and extending over the back 124 of the image sensing die 134. The first high-k dielectric layer 114 and the isolation dielectric liner 118 may be formed by atomic layer deposition (ALD) or other applicable conformal deposition techniques. The first high-k dielectric layer 114 may have a thickness in a range of about 30 Å to about 500 Å, for example. The isolation dielectric liner 118 may have a thickness in a range of about 50 Å to about 3000 Å, for example. Dielectric material that is easier to overhang when formed is not desired as the dielectric material to fill in the deep trenches 1202, since filling this kind of material in the deep trenches 1202 may cause voids enclosed in the deep trenches 1202, which would negatively affect optical and electrical performance of the image sensor.

Figure 13:
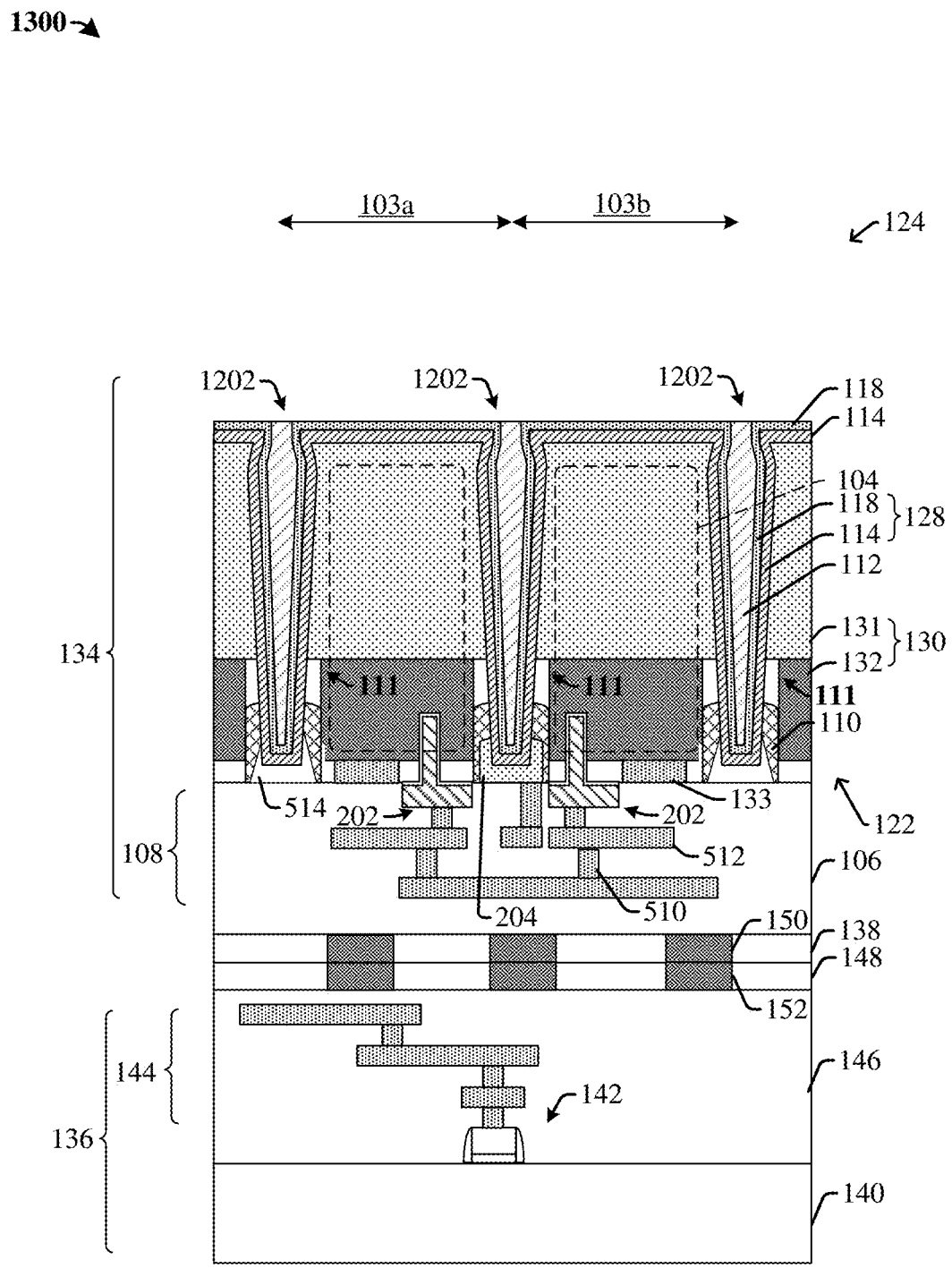

As shown in cross-sectional view 1300 of FIG. 13, in some embodiments, a trench filling layer 112 is formed to fill a remainder of the deep trenches 1202. In some embodiments, the trench filling layer 112 is or is comprised of metal, such as aluminum, ruthenium, or the like. The trench filling layer 112 may be deposited using a physical vapor deposition technique or a chemical vapor deposition technique. The trench filling layer 112 may subject to a planarization process that removes lateral portions of the overlying the trench filling layer 112 directly overlying the image sensing elements 104. As a result, the BDTI structure 111 is formed in the substrate 102, extending from the back 124 to a position within the photodiode doping layer 130. The BDTI structure 111 is formed between and isolate adjacent pixel regions 103*a*, 103*b*.

Figure 14:
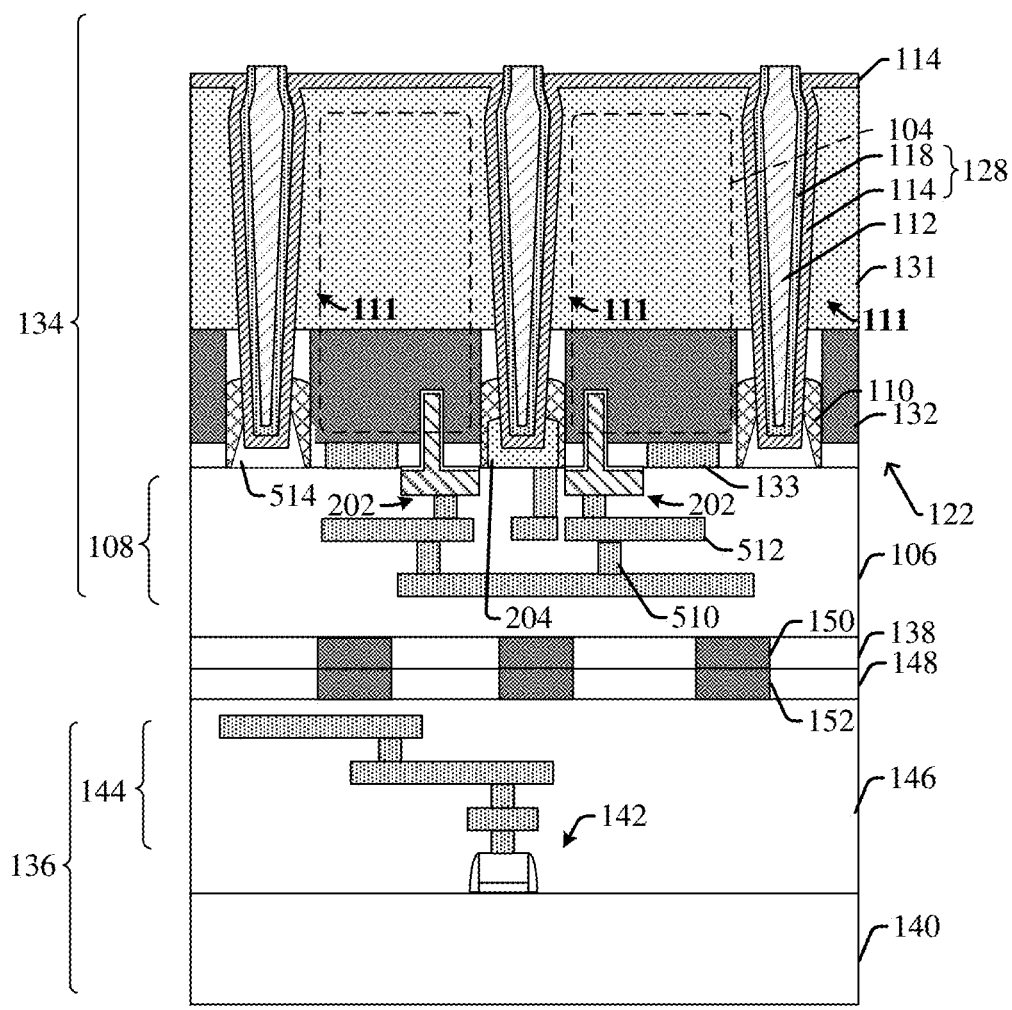

As shown in cross-sectional view 1400 of FIG. 14, in some embodiments, lateral portions of the isolation dielectric liner 118 may be removed from regions overlying the image sensing elements 104. In some embodiments, the isolation dielectric liner is partially removed by a wet dip, using dilute HF for example. The first high-k dielectric layer 114 and the isolation dielectric liner 118 reduce blooming and crosstalk between the pixel regions 103*a*, 103*b*.

Figure 15:
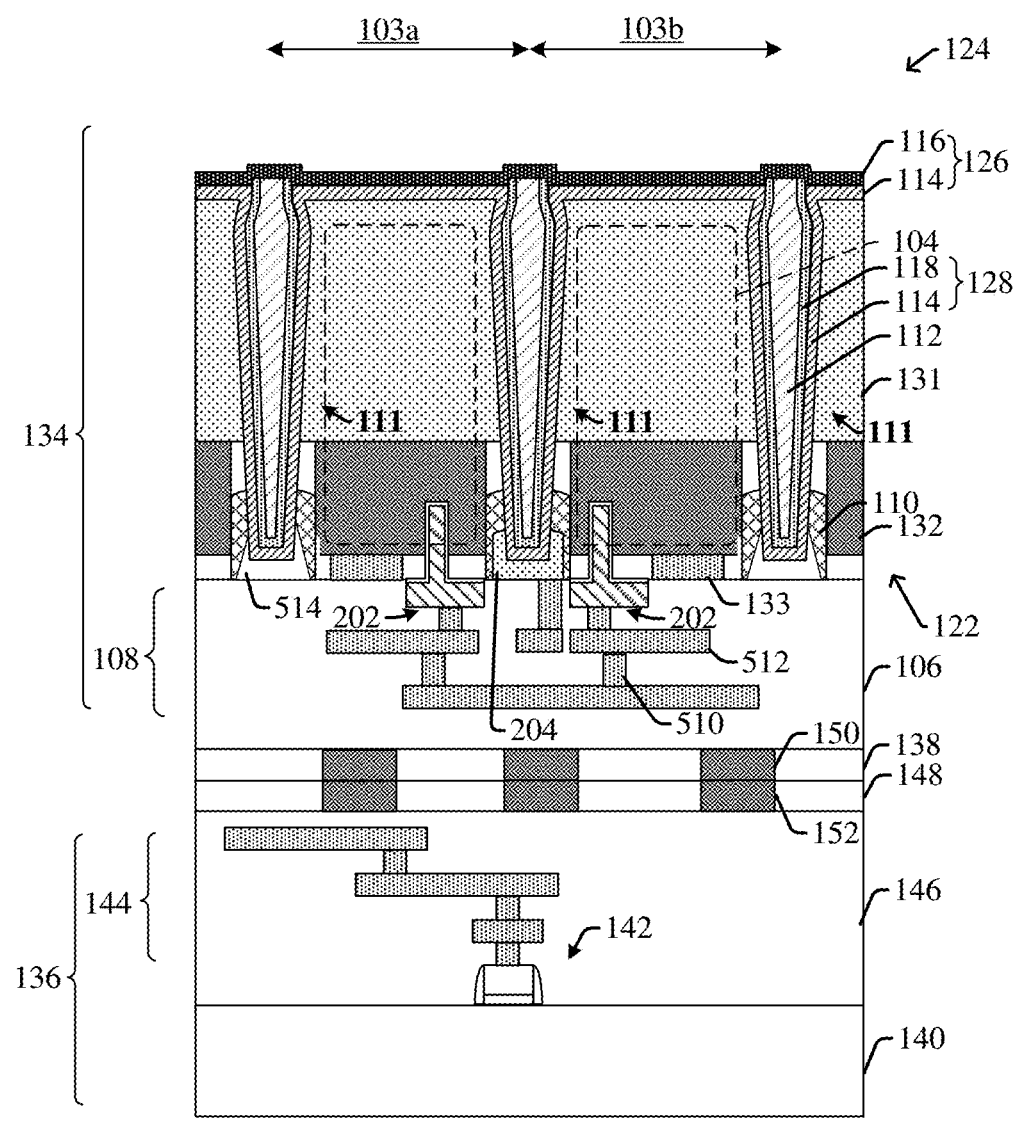

As shown in cross-sectional view 1500 of FIG. 15, in some embodiments, a second high-k dielectric layer 116 is formed on top surfaces of the first high-k dielectric layer 114 and the trench filling layer 112. In some embodiments, the second high-k dielectric layer 116 is or is comprised of tantalum oxide ($Ta_2O_5$). The second high-k dielectric layer 116 enhances optical absorption within respective pixel regions 103*a*, 103*b*. The second high-k dielectric layer 116 may be formed with a greater thickness than the first high-k dielectric layer 114.

Figure 16:
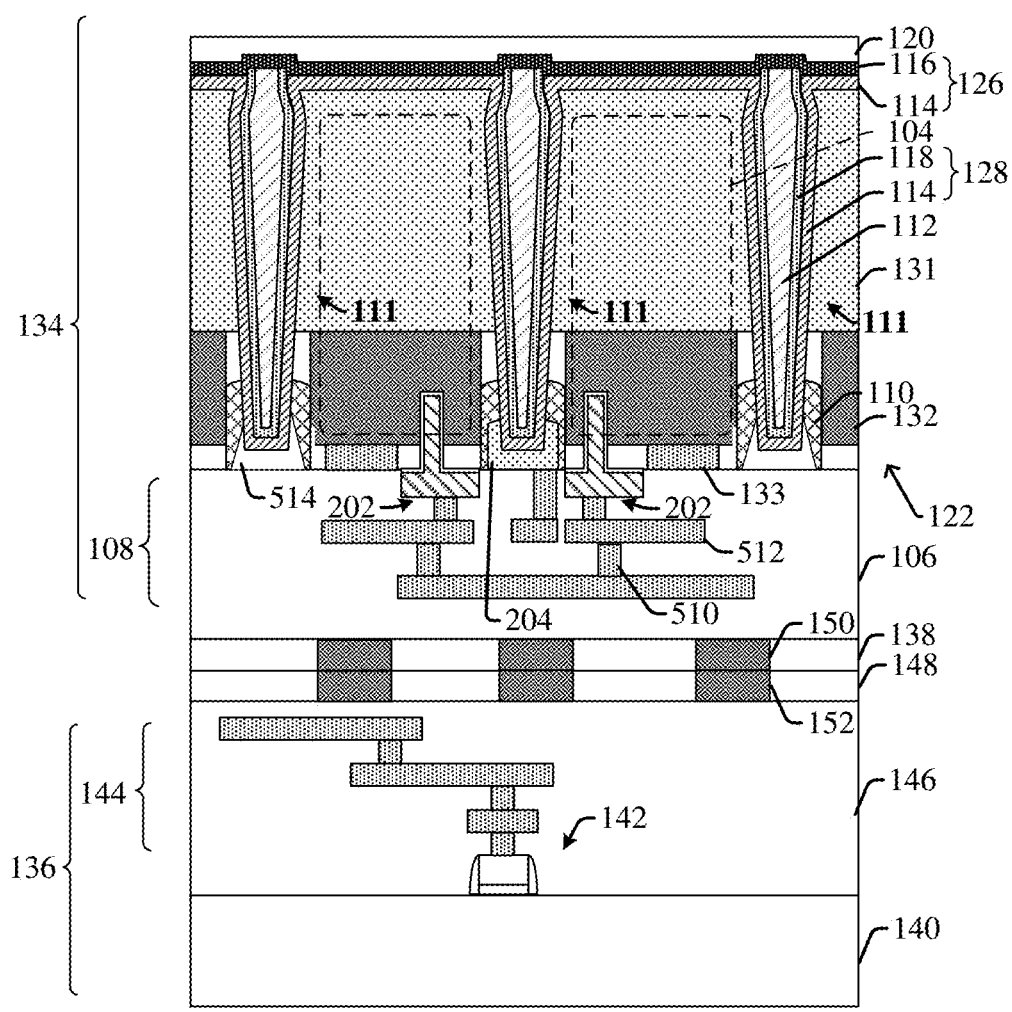

As shown in cross-sectional view 1600 of FIG. 16, in some embodiments, a flat layer 120 is then disposed on the second high-k dielectric layer 116. The flat layer 120 may function as a bottom anti-reflective layer (BARL) to reduce reflection of incident photons. In some embodiments, the flat layer 120 may be or be comprised, for example, silicon oxynitride or some other suitable anti-reflective material(s).

Figure 17:
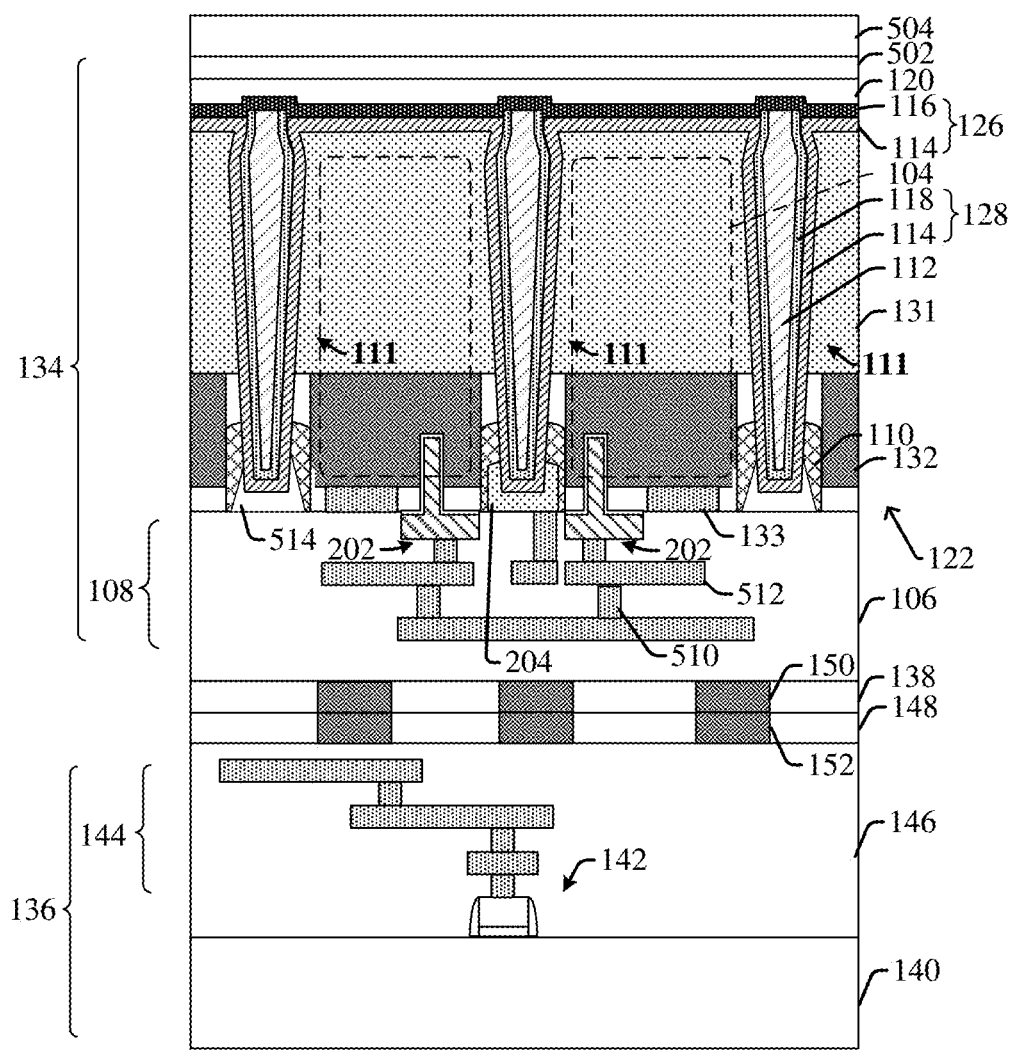
Figure 18:
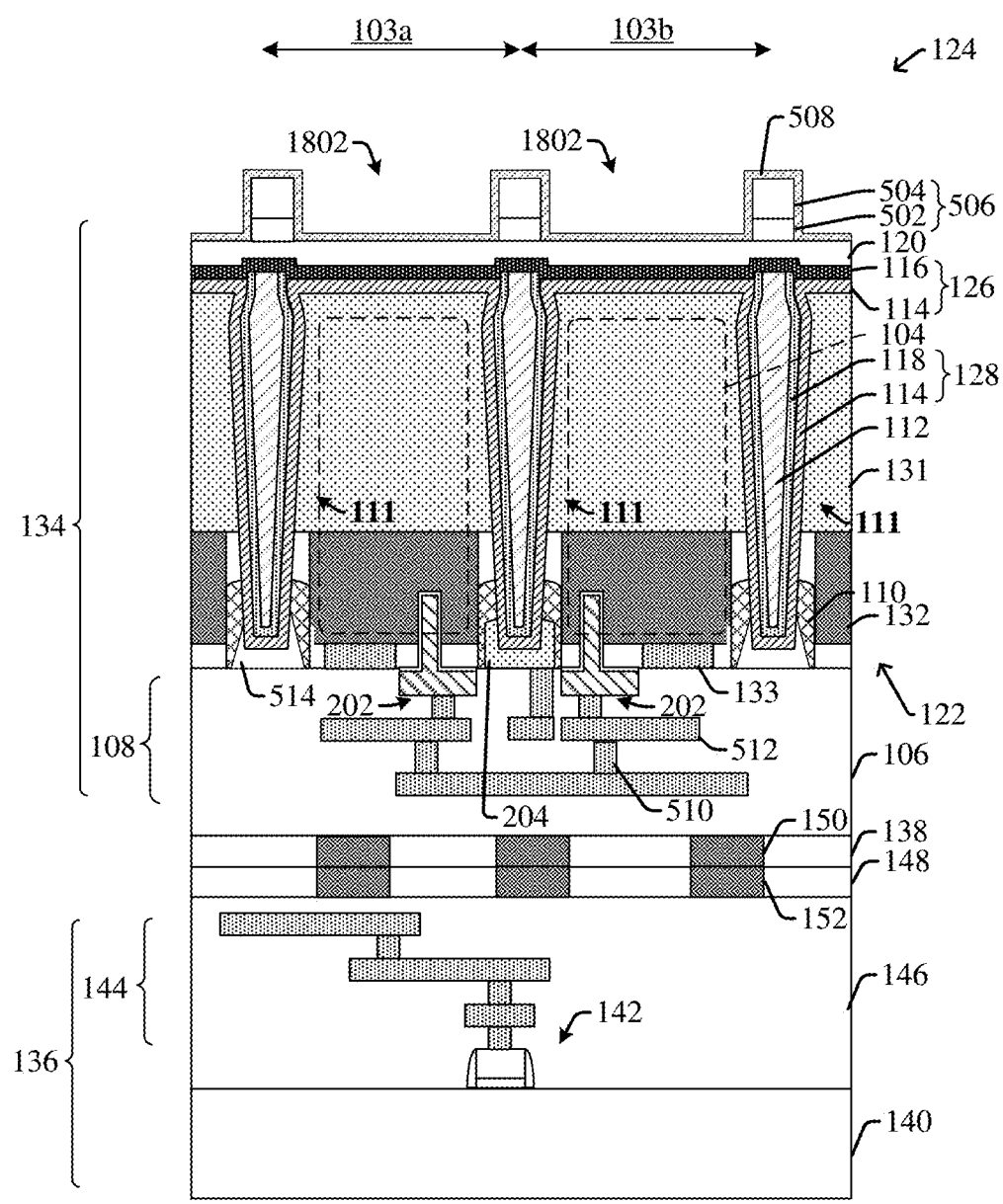
Figure 19:
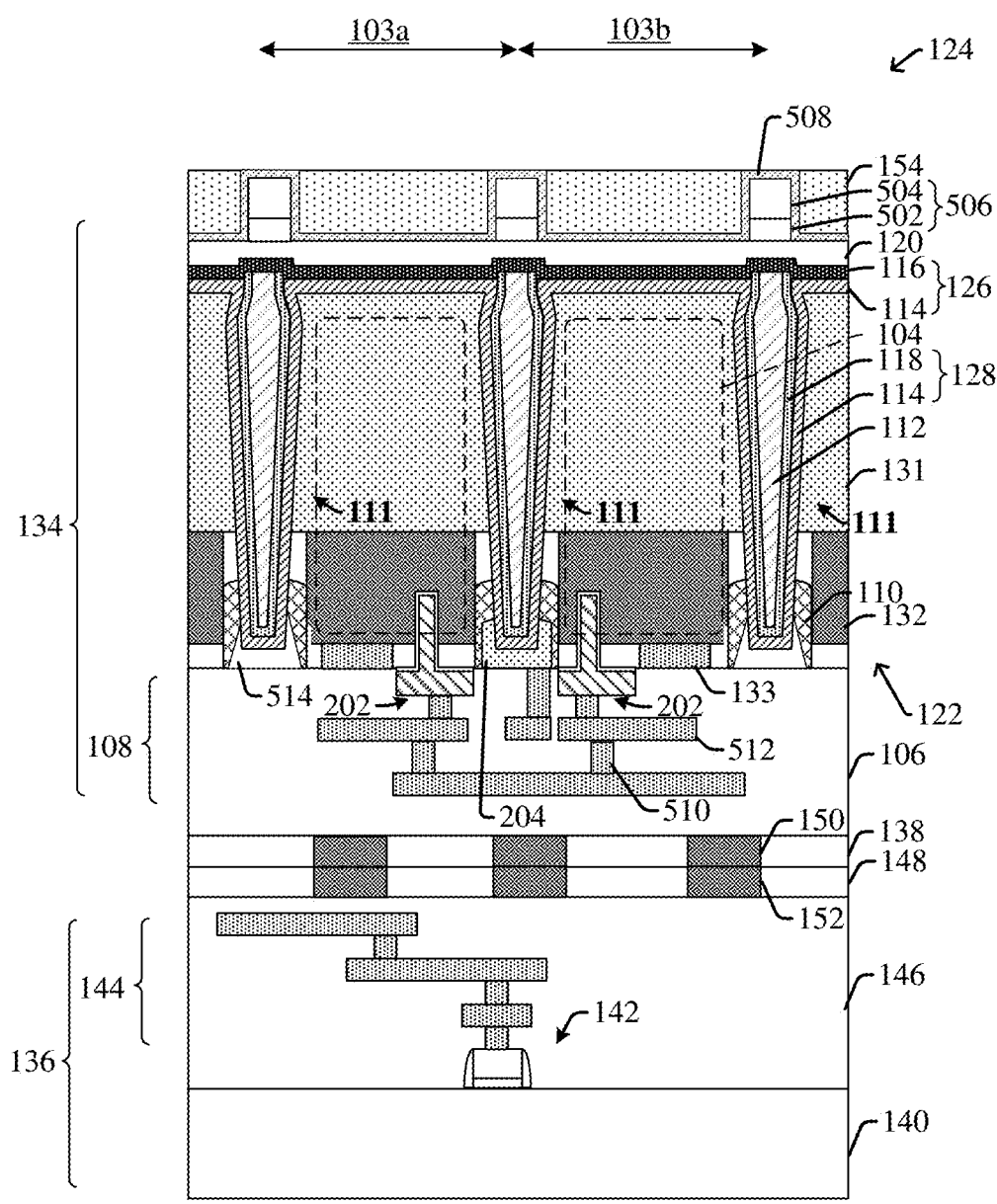

FIGS. 17-19 show some embodiments of a method of forming color filters 154 overlying the image sensing elements 104*a*. As shown in cross-sectional view 1700 of FIG. 17, a metal layer 502 and a dielectric layer 504 are stacked over the substrate 102 along the back side 124 of the image sensing die 134. The metal layer 502 may be or be comprised of one or more layers of tungsten, copper, aluminum copper, or titanium nitride. Other applicable metal materials are also within the scope of the disclosure. The dielectric layer 504 may be or be comprised of one or more layers of silicon dioxide, silicon nitride, or the combination thereof. The dielectric layer 504 may function as a hard mask layer.

As shown in cross-sectional view 1800 of FIG. 18, an etch is performed to the metal layer 502 and the dielectric layer 504 to form the composite grid 506. The openings 1802 may be centrally aligned with the image sensing elements 104 so that the composite grid 506 is arranged around and between the image sensing elements 104. Alternatively, the openings 1802 may be laterally shifted or offset in at least one direction from the image sensing elements 104 so that the composite grid 506 at least partially overlies the image sensing elements 104. Then, a dielectric liner 508 is formed lining sidewall and top of the composite grid 506, and lining the openings 1802. The dielectric liner 508 may be formed using a conformal deposition technique, such as, for example, chemical vapor deposition (CVD) or physical vapor deposition (PVD). The dielectric liner 508 may be, for example, formed of an oxide, such as silicon dioxide.

As shown in cross-sectional view 1900 of FIG. 19, color filters 154 corresponding to pixel sensors are formed in the openings 1802 of the corresponding pixel sensors. The color filter layer is formed of a material that allows light of the corresponding color to pass therethrough, while blocking light of other colors. Further, the color filters 154 may be formed with assigned colors. For example, the color filters 154 are alternatingly formed with assigned colors of red, green, and blue. The color filters 154 may be formed with upper surfaces aligned with that of the composite grid 506. The color filters 154 may be laterally shifted or offset in at least one direction from the image sensing elements 104*a* of the corresponding pixel sensors. Depending upon the extent of the shift or offset, the color filters 154 may partially fill the openings of the corresponding pixel sensors and may partially fill the openings of pixel sensors neighboring the corresponding pixel sensors. Alternatively, the color filters 154 may be symmetrical about vertical axes aligned with photodiode centers of the corresponding pixel sensors. The process for forming the color filters 154 may include, for each of the different colors of the color assignments, forming a color filter layer and patterning the color filter layer. The color filter layer may be planarized subsequent to formation. The patterning may be performed by forming a photoresist layer with a pattern over the color filter layer, applying an etchant to the color filter layer according to the pattern of the photoresist layer, and removing the pattern photoresist layer.

Figure 20:
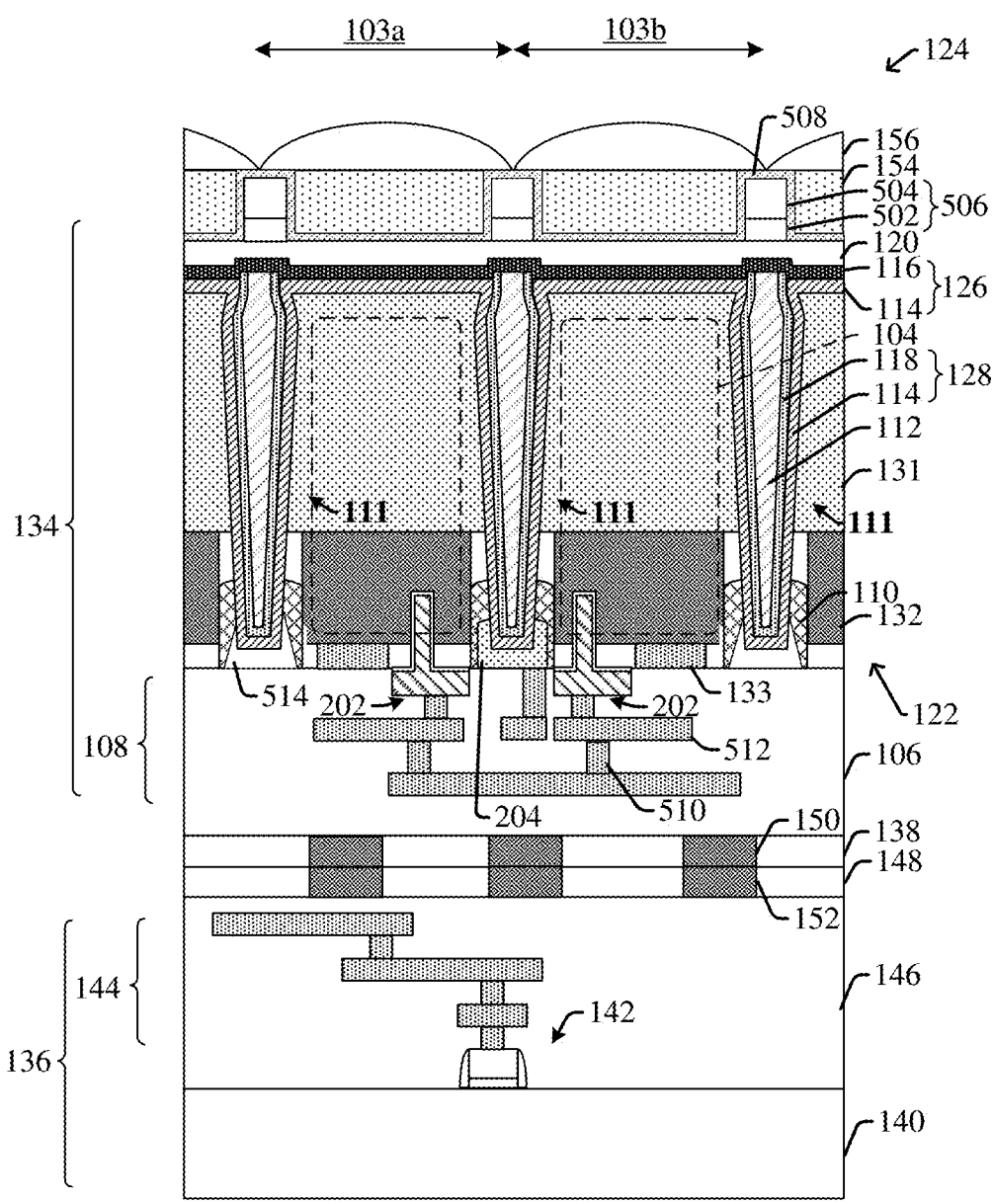

As illustrated by FIG. 20, micro-lenses 156 corresponding to the pixel sensors are formed over the color filters 154 of the corresponding pixel sensors. In some embodiments, the plurality of micro-lenses may be formed by depositing a micro-lens material above the plurality of color filters (e.g., by a spin-on method or a deposition process). A micro-lens template having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The micro-lenses 156 are then formed by selectively etching the micro-lens material according to the micro-lens template.

FIGS. 21-25 illustrate some alternative embodiments of cross-sectional views showing a method of forming an image sensor having an image sensing element overlay by a pixel dielectric stack and surrounded by a BDTI structure.

Figure 21:
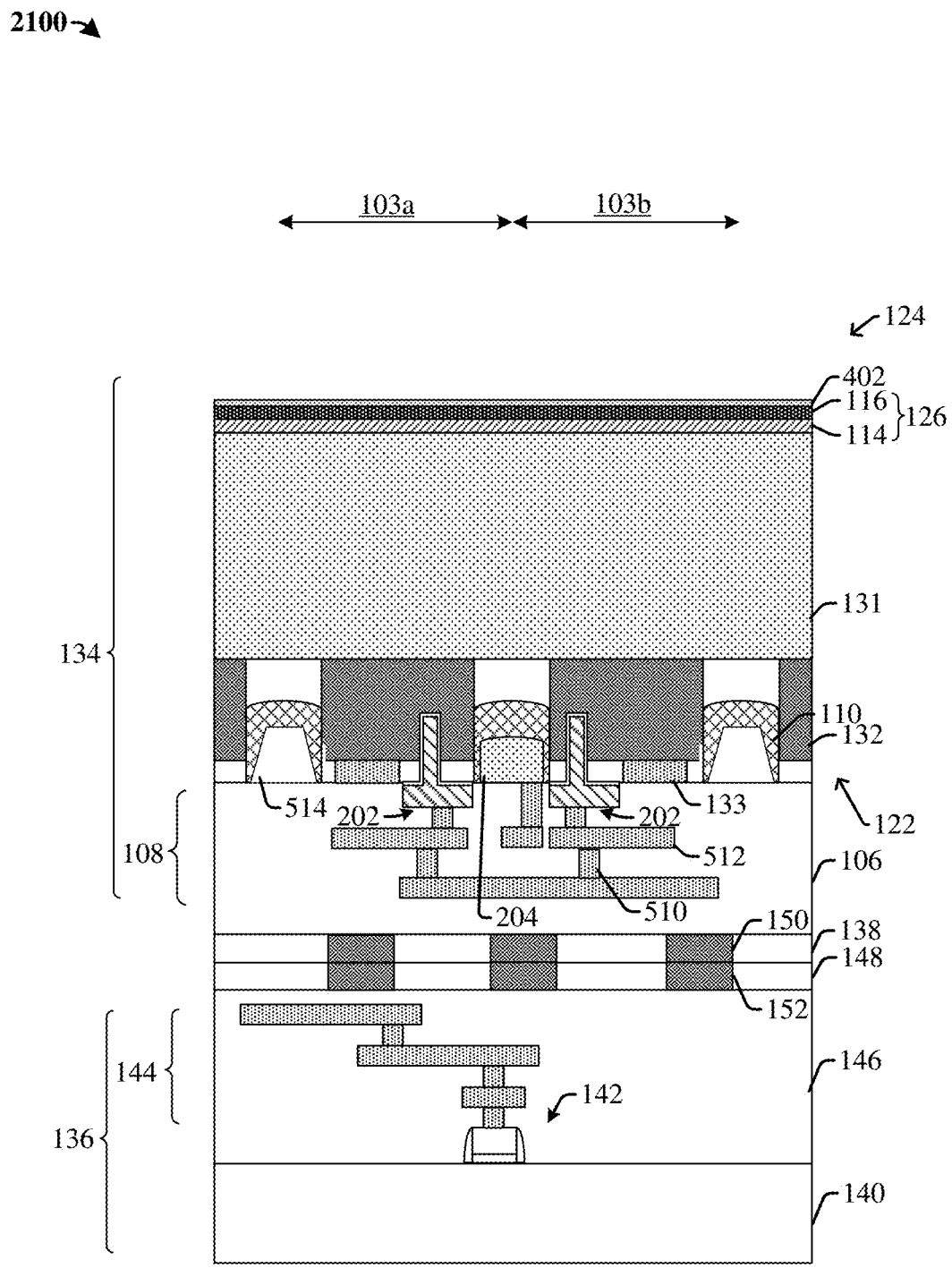
FIGS. 21-25 illustrate some alternative embodiments of cross-sectional views showing a method of forming an image sensor having an image sensing element underlying a pixel dielectric stack and surrounded by a BDTI structure.

Continued from FIG. 10, as shown in cross-sectional view 2100 of FIG. 21, in some embodiments, the image sensing die 134 is thinned on the back 124 to remove the substrate 102. The thinning process may partially or completely remove the p-type substrate (See FIG. 10) and allow for radiation to pass through the back 124 of the image sensing die 134 to the image sensing element 104. The thinning process may be performed by an etching or a mechanical grinding of the back 124 of the image sensing die 134. In some embodiments, a pixel dielectric stack 126 is formed along the back 124 of the image sensing die 134 prior to forming deep trenches 1202. The pixel dielectric stack 126 may include a first high-k dielectric layer 114 and a second high-k dielectric layer 116 formed on top surfaces of the first high-k dielectric layer 114. A hard masking layer 402 may be formed on top of the pixel dielectric stack 126. In some embodiments, the second high-k dielectric layer 116 is or is comprised of tantalum oxide ($Ta_2O_5$). The second high-k dielectric layer 116 enhances optical absorption within respective pixel regions 103a, 103b.

Figure 22:
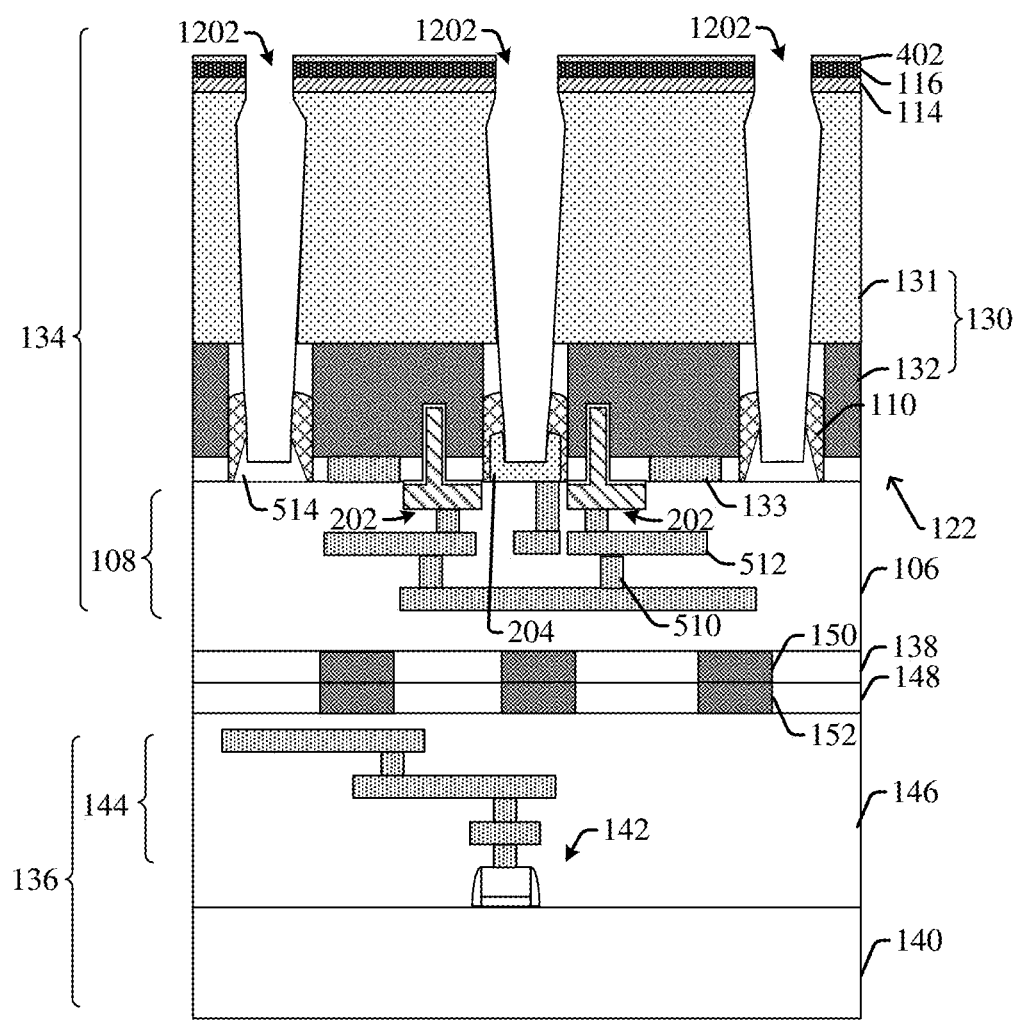

As shown in cross-sectional view 2200 of FIG. 22, the deep trenches 1202 are formed from the back 124 of the image sensing die 134 though the pixel dielectric stack 126 laterally separating the photodiode doping layer 130 the image sensing elements 104. The deep trenches 1202 may be formed by etching the pixel dielectric stack 126 and the photodiode doping layer 130 according to the patterned hard masking layer 402.

Figure 23:
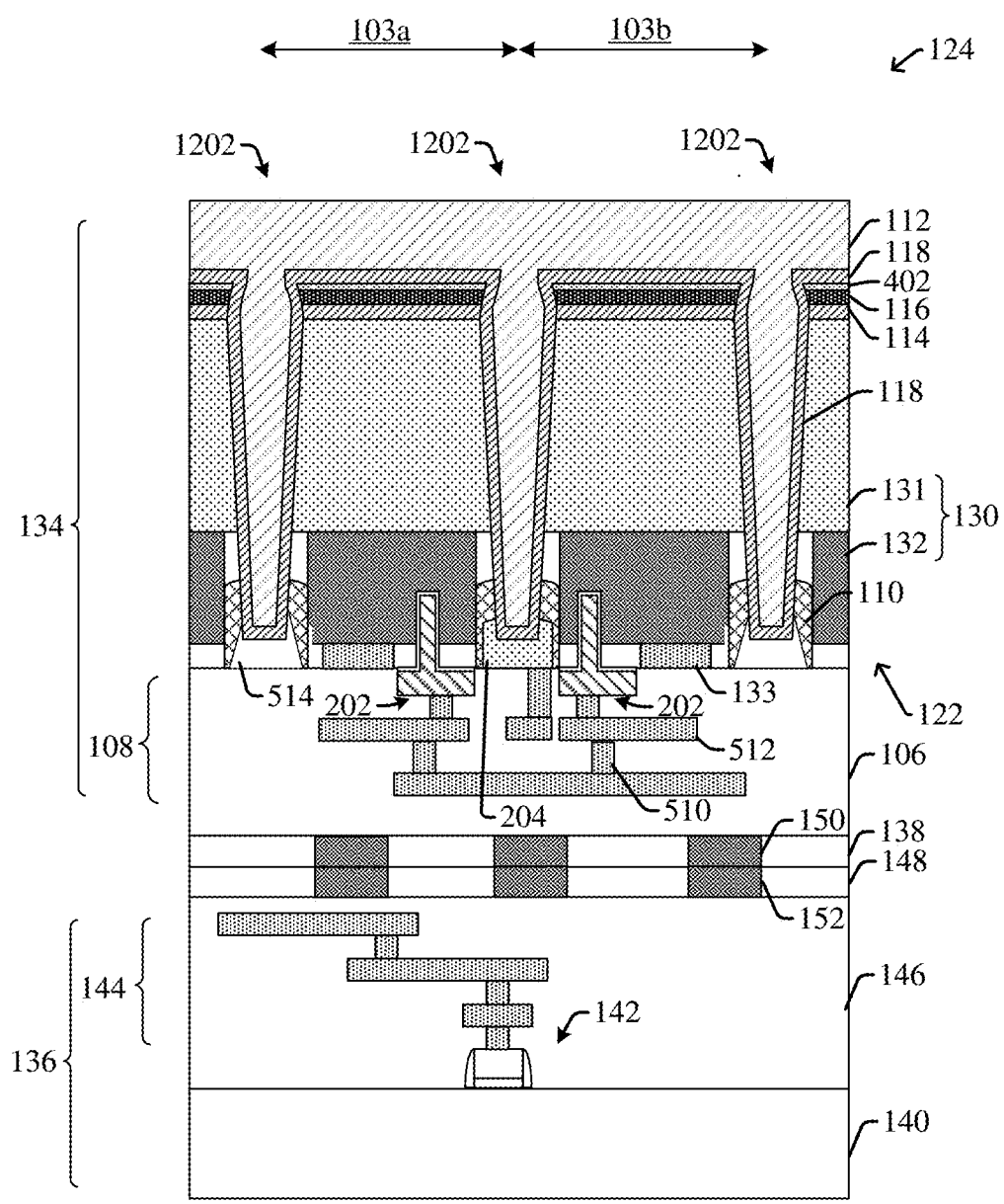

As shown in cross-sectional view 2300 of FIG. 23, in some embodiments, an isolation dielectric liner 118 and a trench filling layer 112 are formed to fill the deep trenches 1202. In some embodiments, the isolation dielectric liner 118 is made of high-k dielectric material such as $AL_2O_3$. Alternatively, the isolation dielectric liner 118 is made of silicon dioxide. In some embodiments, the trench filling layer 112 is or is comprised of metal, such as aluminum, ruthenium, or the like. The trench filling layer 112 may be deposited using a physical vapor deposition technique or a chemical vapor deposition technique.

Figure 24:
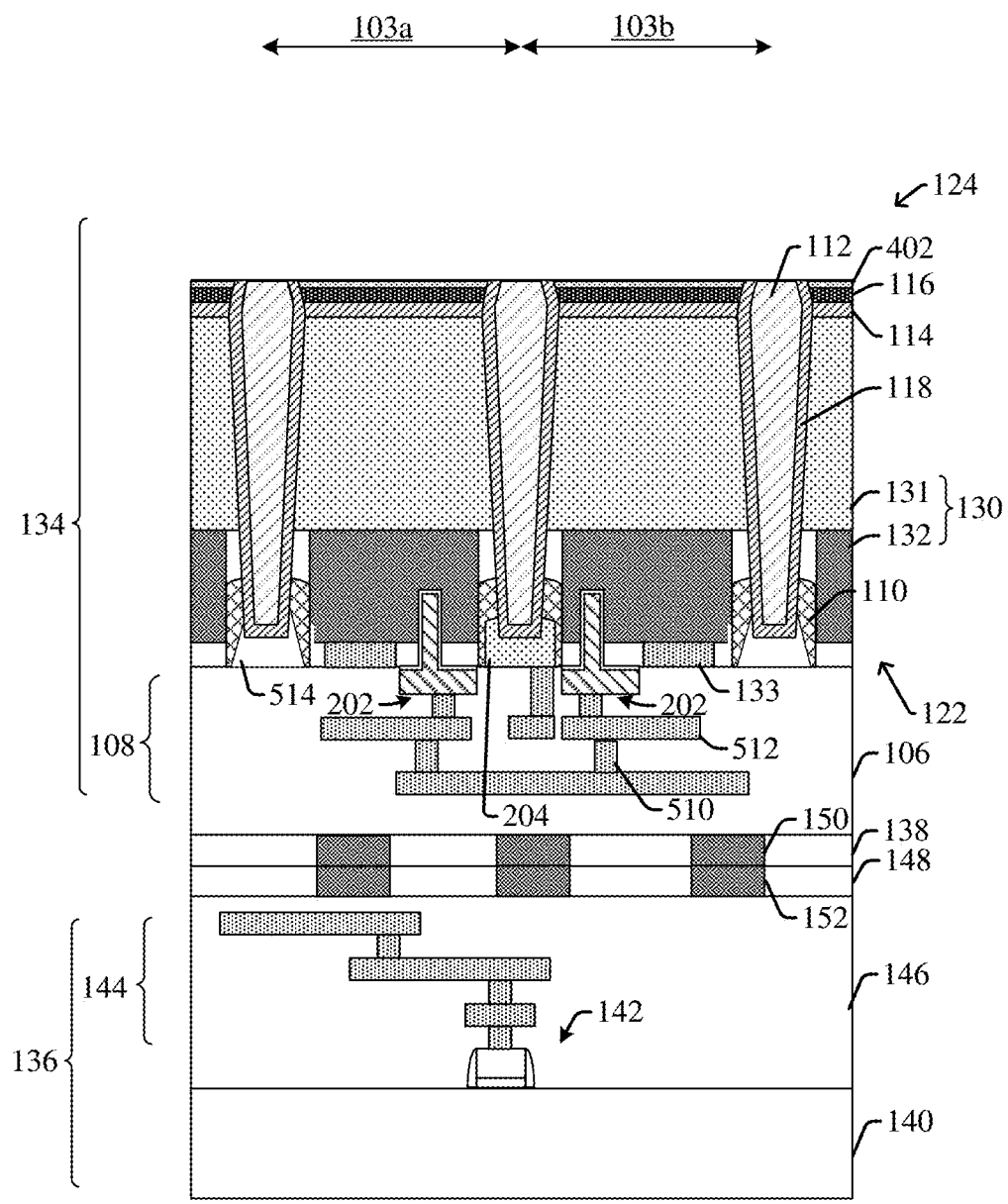

As shown in cross-sectional view 2400 of FIG. 24, in some embodiments, the trench filling layer 112 and the isolation dielectric liner 118 may subject to a planarization process or another etching process that removes lateral portions of the overlying the trench filling layer 112 and the isolation dielectric liner 118 directly overlying the respective pixel regions 103a, 103b. As a result, the BDTI structure 111 is formed in the substrate 102, extending from the back 124 to a position within the photodiode doping layer 130. The BDTI structure 111 is formed between and isolate adjacent pixel regions 103a, 103b.

Figure 25:
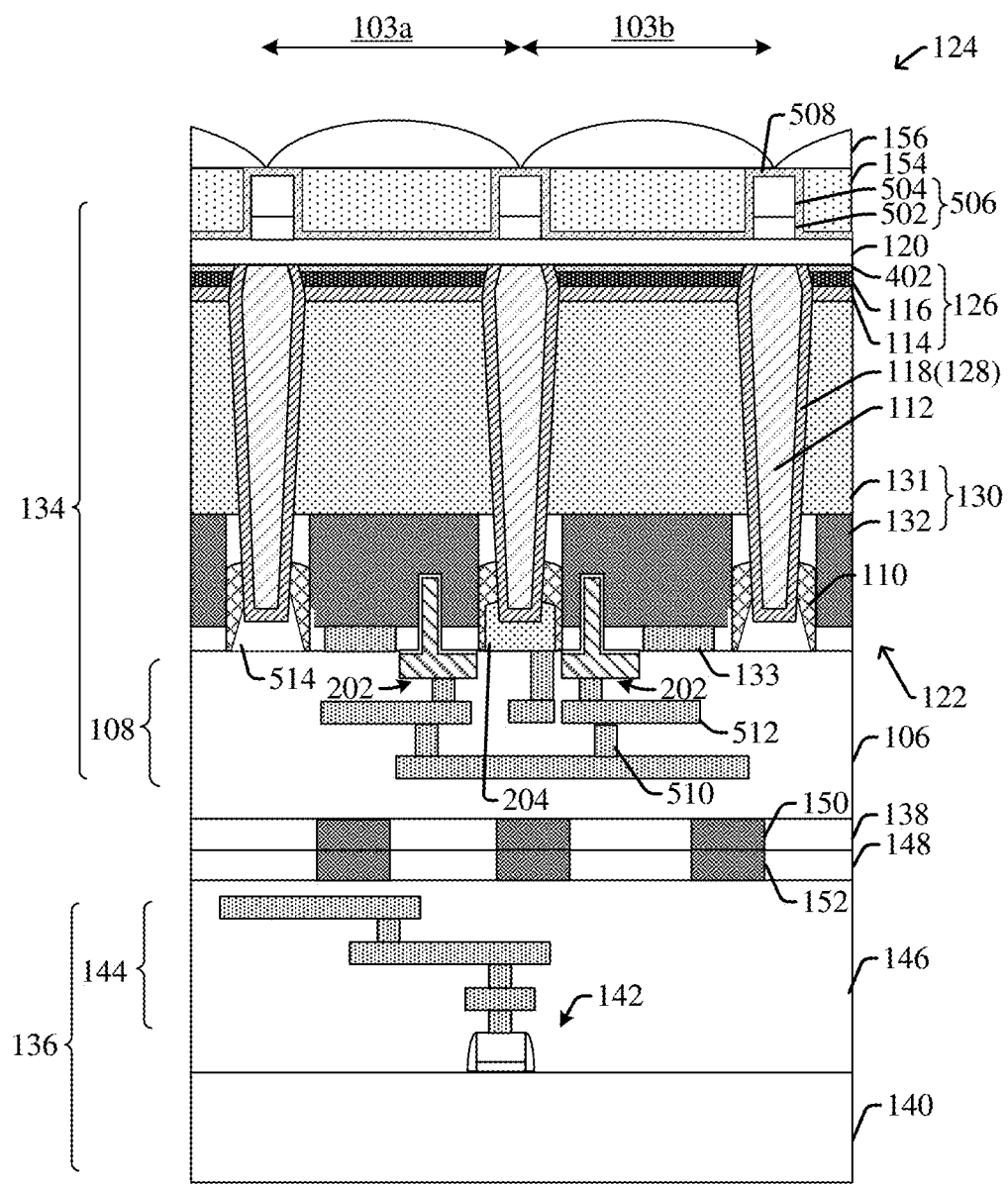

As shown in cross-sectional view 2500 of FIG. 25, similar as shown in FIGS. 17-19, color filters 154 are formed overlying the pixel regions 103a, 103b. In some embodiments, a composite grid 506 of a metal layer 502 and a dielectric layer 504 are stacked over the substrate 102 along the back side 124 of the image sensing die 134. Then, a dielectric liner 508 is formed lining sidewall and top of the composite grid 506. The metal layer 502 may be or be comprised of one or more layers of tungsten, copper, aluminum copper, or titanium nitride. Other applicable metal materials are also within the scope of the disclosure. The dielectric layer 504 may be or be comprised of one or more layers of silicon dioxide, silicon nitride, or the combination thereof. The dielectric layer 504 may function as a hard mask layer.

Figure 26:
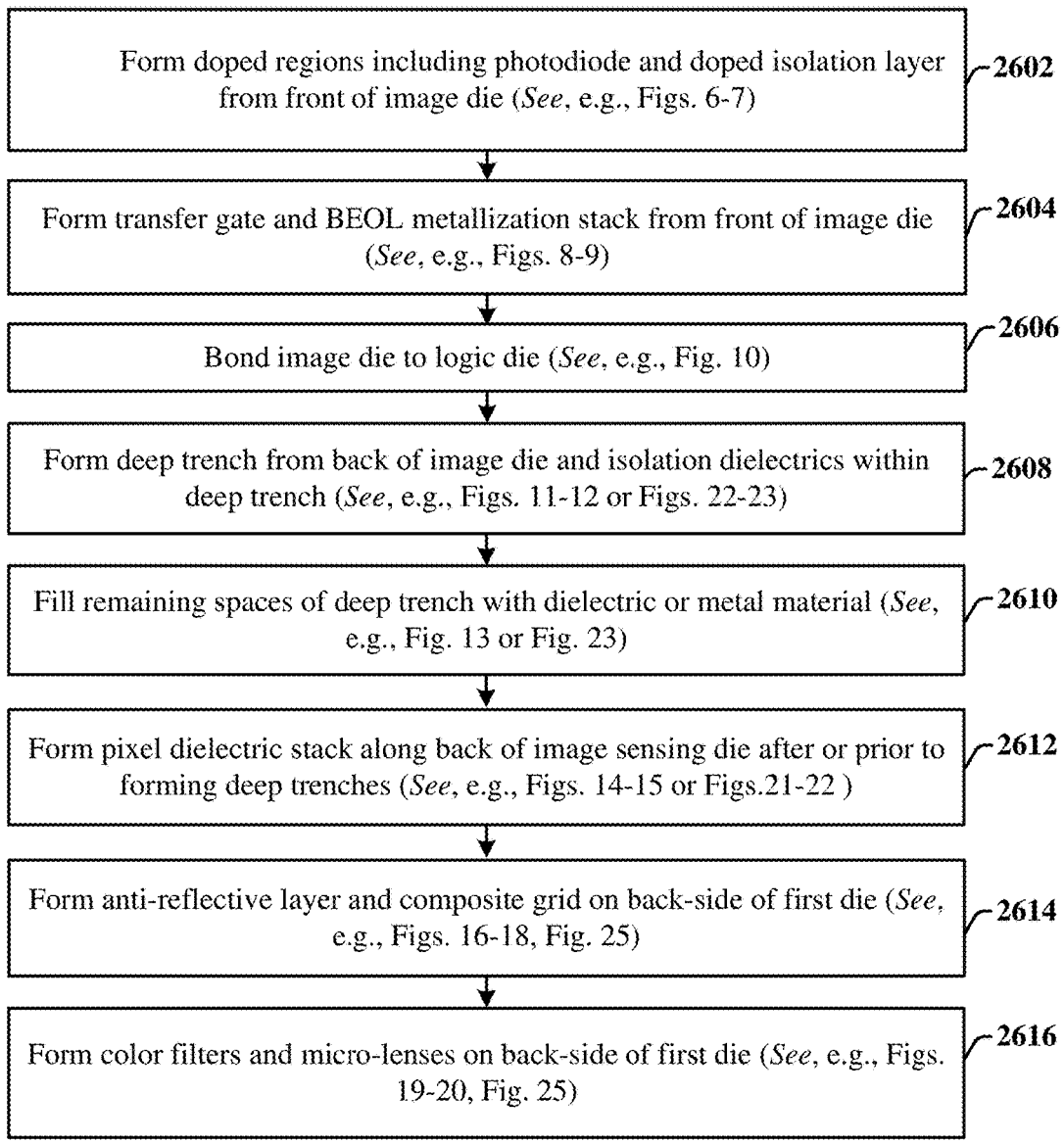
FIG. 26 illustrates a flow diagram of some embodiments of a method of forming an image sensor having an image sensing element underlying a pixel dielectric stack and surrounded by a BDTI structure.

FIG. 26 illustrates a flow diagram of some embodiments of a method 2600 of forming an image sensor having an image sensing element surrounded by a BDTI structure. While disclosed method 2600 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2602, a substrate is prepared for an image sensing die. A photodiode doping layer and a doped isolation well may be formed in the substrate from a front of the image sensing die. In some embodiments, various epitaxial layers may be formed over the substrate as the photodiode doping layer, and photodiode doping columns and/or doped isolation wells may be formed by implanting dopant species into the epitaxial layer. The doped isolation wells may be formed by a selective implantation to form a plurality of columns extending into the photodiode doping layer. In some embodiments, a shallow trench isolation region may be formed within the front of the image sensing die by selectively etching the substrate to form shallow-trenches and subsequently forming a dielectric (e.g. an oxide) within the shallow-trenches. FIGS. 6-7 illustrate cross-sectional views corresponding to some embodiments corresponding to act 2602.

At act 2604, a transfer gate is formed on the front of the image sensing die. A metallization stack is then formed over the transfer gate. FIGS. 8-9 illustrate cross-sectional views corresponding to some embodiments corresponding to act 2604.

At act 2606, in some embodiments, the image sensor is bonded to one or more other dies such as a logic die or other image sensing dies. FIG. 10 illustrates a cross-sectional view corresponding to some embodiments corresponding to act 2606.

At act 2608, in some embodiments, the substrate is selectively etched from back to form deep trenches between adjacent sensing pixel regions, and isolation dielectrics are formed along sidewall and bottom surfaces of the deep trenches. In some embodiments, the deep trenches and isolation dielectrics are formed after forming a pixel dielectric stack. FIGS. 11-12 or 22-23 illustrate cross-sectional views corresponding to some embodiments corresponding to act 2608.

At act 2610, remaining spaces of the deep trenches are filled with dielectric or metal material. FIG. 13 or FIG. 23 illustrates a cross-sectional view corresponding to some embodiments corresponding to act 2610.

At act 2612, a pixel dielectric stack is formed along the back of the image sensing die after or prior to forming the deep trenches. FIG. 14-15 or 21-22 illustrate cross-sectional views corresponding to some embodiments corresponding to act 2612.

At act 2614, anti-reflective layer and composite grid are formed on the back of the image sensing die. FIGS. 16-18 and FIG. 25 illustrates cross-sectional views corresponding to some embodiments corresponding to act 2614.

At act 2616, color filters and micro-lenses are formed on the backside of the image sensing die. FIGS. 19-20 and FIG. 25 illustrate cross-sectional views corresponding to some embodiments corresponding to act 2616.

In some embodiments, the present disclosure relates to an image sensor. The image sensing die has a front and a back opposite to the front. A first image sensing element and a second image sensing element are arranged next to one another within the image sensing die. The first image sensing element and the second image sensing element have a first doping type. A pixel dielectric stack is disposed along the back of the image sensing die overlying the first image sensing element and the second image sensing element. The pixel dielectric stack includes a first high-k dielectric layer and a second high-k dielectric layer disposed over the first high-k dielectric layer. A backside deep trench isolation (BDTI) structure is disposed between the first image sensing element and the second image sensing element and extending from the back of the image sensor die to a position within the image sensor die. The BDTI structure comprises a trench filling layer surrounded by an isolation dielectric stack. The pixel dielectric stack has a first composition different from a second composition of the isolation dielectric stack.

In some alternative embodiments, the present disclosure relates to an image sensor. The image sensing die has a front and a back opposite to the front. An image sensing element of a first doping type is disposed within the image sensing die. A BDTI structure surrounds the image sensing element and extends from the back of the image sensor die to a position within the image sensor die. The BDTI structure comprises a trench filling layer surrounded by a first high-k dielectric layer. The first high-k dielectric layer is disposed along bottom and sidewall surfaces of the trench filling layer and extends upwardly to cover a lateral surface of the image sensing element. A second high-k dielectric layer is disposed on the first high-k dielectric layer and extends in lateral covering a top surface of the trench filling layer.

In yet other embodiments, the present disclosure relates to a method of forming an image sensor. The method comprises forming a photodiode doping layer with a first doping type within a substrate from a front of an image sensing die and forming a deep trench from a back of the image sensing die separating the photodiode doping layer to a first image sensing element and a second image sensing element. The method further comprises forming a first high-k dielectric layer and an isolation dielectric liner along bottom and sidewall surfaces of the deep trench and extending upwardly along a lateral surface of the first image sensing element and the second image sensing element. The method further comprises forming a trench filling layer in an inner space of the deep trench and forming a second high-k dielectric layer on top surfaces of the first high-k dielectric layer and the trench filling layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
an image sensing die having a front and a back opposite to the front;
a first image sensing element and a second image sensing element arranged next to one another within the image sensing die, the first image sensing element and the second image sensing element having a first doping type;
a pixel dielectric stack disposed along the back of the image sensing die overlying the first image sensing element and the second image sensing element, wherein the pixel dielectric stack comprises a first high-k dielectric layer and a second high-k dielectric layer disposed over the first high-k dielectric layer; and
a backside deep trench isolation (BDTI) structure disposed between the first image sensing element and the second image sensing element and extending from the back of the image sensor die to a position within the image sensor die, wherein the BDTI structure comprises a trench filling layer surrounded by an isolation dielectric stack, wherein the isolation dielectric stack comprises an isolation dielectric liner directly contacting the first high-k dielectric layer with a topmost surface higher than a topmost surface of the first high-k dielectric layer; and
wherein the pixel dielectric stack has a first composition different from a second composition of the isolation dielectric stack.

2. The image sensor of claim 1, wherein the second high-k dielectric layer is absent from the BDTI structure.

3. The image sensor of claim 1, wherein the first high-k dielectric layer extends downwardly along the trench filling layer as part of the isolation dielectric stack.

4. The image sensor of claim 1, wherein the second high-k dielectric layer covers extends laterally across the entire topmost surface of the BDTI structure.

5. The image sensor of claim 1, wherein the first high-k dielectric layer and the second high-k dielectric layer have vertical ending sidewalls that terminate at and directly contacts an upper sidewall of the isolation dielectric stack.

6. The image sensor of claim 1, wherein the topmost surface of the isolation dielectric liner locates between topmost and bottommost of the second high-k dielectric layer.

7. The image sensor of claim 1, wherein the isolation dielectric liner is of silicon dioxide.

8. The image sensor of claim 1, wherein the isolation dielectric liner comprises high-k dielectric material.

9. The image sensor of claim 1, wherein the isolation dielectric stack further comprises an isolation conductive liner disposed between the isolation dielectric liner and the trench filling layer.

10. The image sensor of claim 1, wherein the trench filling layer is metal.

11. The image sensor of claim 1, further comprising:
a doped isolation well with a second doping type disposed between the first image sensing element and the second image sensing element and extending from the front of the image sensing die to a position within the image sensing die;
wherein the doped isolation well has a bottom surface recessed by the BDTI structure.

12. The image sensor of claim 1, further comprising:
a shallow trench isolation (STI) structure disposed between the first image sensing element and the second image sensing element extending from the front of the image sensing die to a position within the image sensing die.

13. The image sensor of claim 1, wherein the first high-k dielectric layer comprises aluminum oxide ($Al_2O_3$), hafnium oxide ($HfO_2$), hafnium silicon oxide (HfSiO), or hafnium aluminum oxide (HfAlO).

14. The image sensor of claim 1, wherein the second high-k dielectric layer comprises tantalum oxide ($Ta_2O_5$).

15. The image sensor of claim 1, wherein the second high-k dielectric layer is about two times or thicker than the first high-k dielectric layer.

16. An image sensor, comprising:
an image sensing die having a front and a back opposite to the front;
an image sensing element disposed within the image sensing die, the image sensing element having a first doping type;
a backside deep trench isolation (BDTI) structure surrounding the image sensing element and extending from the back of the image sensor die to a position within the image sensor die, wherein the BDTI structure comprises a trench filling layer surrounded by a first high-k dielectric layer, wherein the first high-k dielectric layer is disposed along bottom and sidewall surfaces of the trench filling layer and extends upwardly to cover a lateral surface of the image sensing element; and
a second high-k dielectric layer disposed on the first high-k dielectric layer and extended in lateral crossing a topmost surface of the trench filling layer.

17. The image sensor of claim 16, wherein the second high-k dielectric layer comprises a first portion vertically overlying the BDTI structure and a second portion vertically overlying the image sensing element, wherein the first portion has a lower lateral surface locating higher than that of the second portion.

18. The image sensor of claim 16, further comprising an isolation dielectric liner disposed between the first high-k dielectric layer and the trench filling layer.

19. An image sensor, comprising:
a photodiode doping layer with a first doping type disposed within a substrate, the photodiode doping layer comprising a first image sensing element and a second image sensing element arranged one next to another;
a backside deep trench isolation (BDTI) structure disposed within a deep trench of the photodiode doping layer separating the first image sensing element and the second image sensing element, and extending to overlie the first image sensing element and the second image sensing element;
wherein the BDTI structure comprises:
a first high-k dielectric layer and an isolation dielectric liner disposed along bottom and sidewall surfaces of the deep trench, wherein the first high-k dielectric layer extends upwardly along a lateral surface of the first image sensing element and the second image sensing element;
a trench filling layer disposed in an inner space of the deep trench; and
a second high-k dielectric layer disposed directly on topmost surfaces of the first high-k dielectric layer and the trench filling layer.

20. The image sensor of claim 19, wherein the isolation dielectric liner and the trench filling layer have entire topmost surfaces coplanar with that of the first high-k dielectric layer.

* * * * *